(12) United States Patent
Zimmermann et al.

(10) Patent No.: US 12,406,823 B2
(45) Date of Patent: Sep. 2, 2025

(54) ELECTRODE STRUCTURE FOR GUIDING A CHARGED PARTICLE BEAM

(71) Applicant: FRIEDRICH-ALEXANDER-UNIVERSITÄT ERLANGEN-NÜRNBERG, Erlangen (DE)

(72) Inventors: Robert Zimmermann, Erlangen (DE); Michael Seidling, Erlangen (DE); Peter Hommelhoff, Erlangen (DE)

(73) Assignee: FRIEDRICH-ALEXANDER-UNIVERSITÄT ERLANGEN-NÜRNBERG, Erlangen (DE)

( * ) Notice: Subject to any disclaimer, the term of this patent is extended or adjusted under 35 U.S.C. 154(b) by 321 days.

(21) Appl. No.: 17/922,093

(22) PCT Filed: Apr. 27, 2021

(86) PCT No.: PCT/EP2021/060958
§ 371 (c)(1),
(2) Date: Oct. 28, 2022

(87) PCT Pub. No.: WO2021/219621
PCT Pub. Date: Nov. 4, 2021

(65) Prior Publication Data
US 2023/0170177 A1   Jun. 1, 2023

(30) Foreign Application Priority Data

Apr. 30, 2020   (DE) .................... 10 2020 111 820.1

(51) Int. Cl.
*H01J 37/147*   (2006.01)
*G06N 10/40*   (2022.01)
(Continued)

(52) U.S. Cl.
CPC .......... *H01J 37/1472* (2013.01); *H01J 37/05* (2013.01); *H01J 2237/057* (2013.01); *H01J 2237/1516* (2013.01); *H01J 2237/26* (2013.01)

(58) Field of Classification Search
CPC .. H01J 37/1472; H01J 37/05; H01J 2237/057; H01J 2237/1516; H01J 2237/26; H01J 37/147; G06N 10/40; G21K 1/087
See application file for complete search history.

(56) References Cited

U.S. PATENT DOCUMENTS

2009/0026250 A1   1/2009   Tanno et al.
2009/0026361 A1   1/2009   Syms et al.
(Continued)

FOREIGN PATENT DOCUMENTS

DE   102010003578 A1   12/2010
DE   112007002661 B4   10/2019
(Continued)

OTHER PUBLICATIONS

International Search Report (English and German) and Written Opinion of the ISA (German) issued in PCT/EP2021/060958, mailed Sep. 13, 2021; ISA/EP.
(Continued)

*Primary Examiner* — David E Smith
*Assistant Examiner* — Laura Eloise Tandy
(74) *Attorney, Agent, or Firm* — Harness, Dickey & Pierce, P.L.C.

(57) ABSTRACT

An electrode structure for guiding and, for example, for splitting a beam of charged particles, for example an electron beam, along a longitudinal path has multipole electrode arrangements that are spaced apart from one another along the longitudinal path and that have DC voltage electrodes. The electrode arrangements are configured to generate static multipole fields centered around the path in transverse (Continued)

Figure 1:
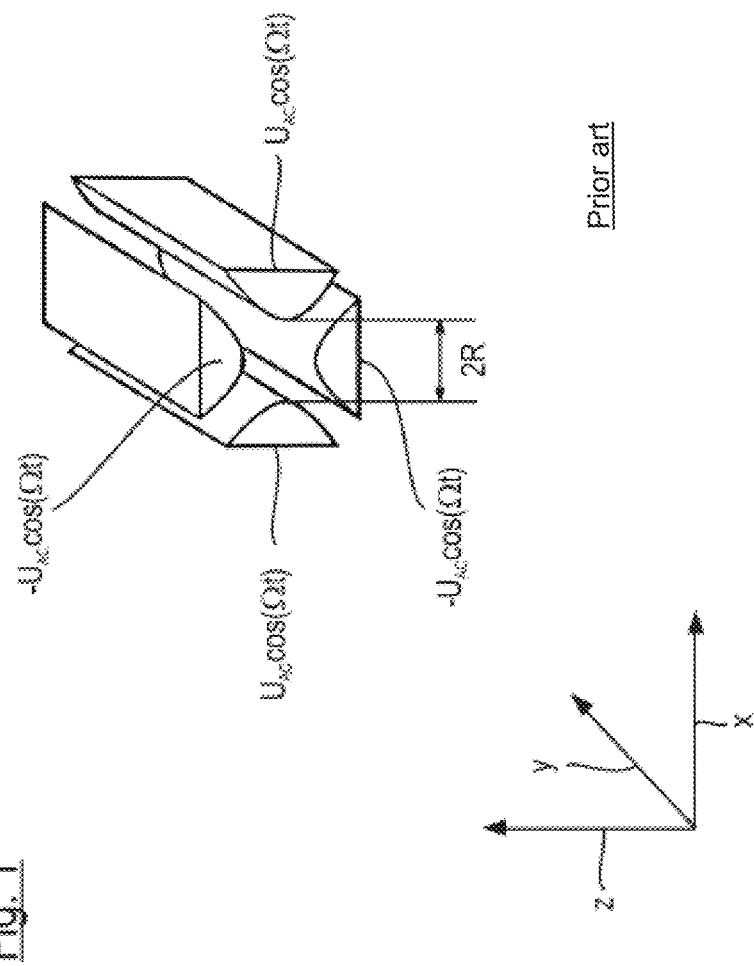

planes oriented perpendicular to the longitudinal path, wherein the field strengths of the static multipole fields in the transverse planes each have a local minimum at the location of the path and increase as the distance from the location of the path increases. Field directions of the static multipole fields vary periodically with a period length along the path so that the particles propagating along the path are subjected to an inhomogeneous alternating electric field due to their intrinsic movement and experience a transverse return force towards the longitudinal path on average over time.

24 Claims, 24 Drawing Sheets

(51) Int. Cl.
*G21K 1/087* (2006.01)
*H01J 37/05* (2006.01)

(56) References Cited

U.S. PATENT DOCUMENTS

| | | | |
|---|---|---|---|
| 2009/0206250 | A1 | 8/2009 | Wollnik |
| 2009/0272902 | A1* | 11/2009 | Soeda ............... H01J 37/05 250/311 |
| 2009/0283674 | A1 | 11/2009 | Pesch |
| 2010/0031210 | A1 | 2/2010 | Okamoto |
| 2010/0176295 | A1 | 7/2010 | Senko et al. |
| 2013/0175443 | A1* | 7/2013 | Schoen ............... H01J 49/26 250/288 |
| 2013/0187044 | A1 | 7/2013 | Ding et al. |
| 2014/0353491 | A1 | 12/2014 | Hager et al. |
| 2017/0025242 | A1* | 1/2017 | Hammer ............ H01J 37/1472 |
| 2017/0047216 | A1* | 2/2017 | Schwieters ........ H01J 49/061 |
| 2019/0189393 | A1* | 6/2019 | Ibrahim .............. H01J 37/21 |
| 2019/0287779 | A1* | 9/2019 | Slater ................. H01J 49/065 |
| 2020/0168447 | A1* | 5/2020 | Verenchikov ....... H01J 49/025 |
| 2020/0312609 | A1* | 10/2020 | Shur .................... H01J 37/222 |

FOREIGN PATENT DOCUMENTS

| | | |
|---|---|---|
| EP | 3161852 B1 | 6/2018 |
| WO | WO-2019030471 A1 | 2/2019 |
| WO | WO-2019030475 A1 | 2/2019 |
| WO | WO-2019030476 A1 | 2/2019 |

OTHER PUBLICATIONS

Leibfried et al.: "*Quantum dynamics of single trapped ions*", Rev. Mod. Phys., vol. 75, p. 281 ff., 2003.
Allers, M. [et al.]: Printed Circuit board based segmented quadrupole ion guide. In: Int. J. Mass Spectrom., vol. 443, 2019, pp. 32-40.
Chiaverini, J. [et al.]: Surface-Electrode Architecture for Ion-Trap Quantum Information Processing. In: Quantum Info. Comp., vol. 5, No. 6, 2005, pp. 419-439.
Guan, S. [et al.]: Stacked-ring electrostatic ion guide. In: J. Am. Soc. Mass. Spectrom., vol. 7, No. 1, 1996, pp. 101-106.
Hammer, J. [et al]: Microwave Chip-Based Beam Splitter for Low-Energy Guided Electrons. In: Phys. Rev. Lett., vol. 114, 2015, 25480.
Hoffrogge, J. [et al.]: Planar microwave structures for electron guiding. In: New J. Phys., vol. 13, 2011, 095012.
Hoffrogge, J.: A surface-electrode quadrupole guide for electrons. Dissertation LMU München, 2012.
Huber, G. [et al.]: Transport of ions in a segmented linear Paul trap in printed-circuit-board technology. In: New J. Phys., vol. 10, No. 1,2008, 013004.
Massenspektrometrie, http://web.archive.org/web/201607051 <https://protect-us.mimecast.com/s/Q4TeCERZ81H1IQpouNSWwf?domain=web.archive.org>25746/http://dodo.fb06.fh-muenchen.de/maier/analytik/Blaetter/N1 <https://protect-us.mimecast.com/s/41vDCG6YvzCWBVAZc7803q?domain=dodo.fb06.fh-muenchen.de>51_MS_GrundlagenTrennsysteme_c_BAneu.pdf, May 7, 2017, [retrieved on Dec. 22, 2020].
Wesenberg, J.: Electrostatics of surface-electrode ion traps. In: Phys. Rev. A, vol. 78, No. 6, 2008, 063410.
Wesenberg, J.: Ideal intersections for radio-frequency trap networks. Phys. Rev. A, vol. 79, No. 1,2009, 013416. [online].
Zimmermann, R. [et al.]: Beam splitting of low-energy guided electrons with a two-sided microwave chip. In: Appl. Phys. Lett., vol. 115, 2019, 104103.
Teng, Lee C.: Alternate Gradient Electrostatic Focusing for Linear Accelerators, Review of Scientific Instruments 25, 264, 1954 American Institute of Physics, https://doi.org/10.1063/1.1771038 <https://protect-us.mimecast.com/s/5LsQCJ6YyzCpB7KLUz4Z-A?domain=doi.org>, Jun. 22, 1953, published online Dec. 29, 2004.
Chupp, W. et al.: A quadrupole beam transport experiment for heavy ions under extreme space charge conditions; Lawrence Berkeley Laboratory, University of California, Berkeley, California 94720, Mar. 1983.

* cited by examiner

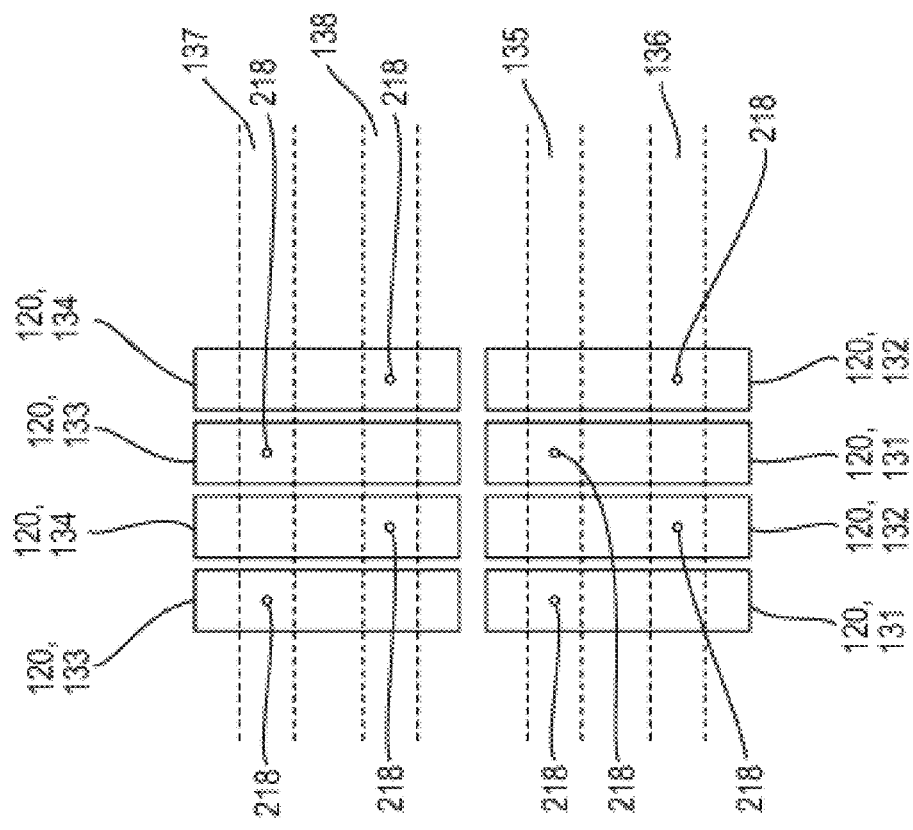
Fig. 16
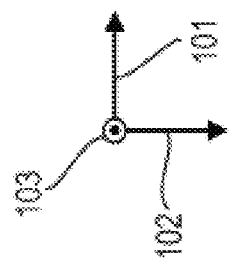

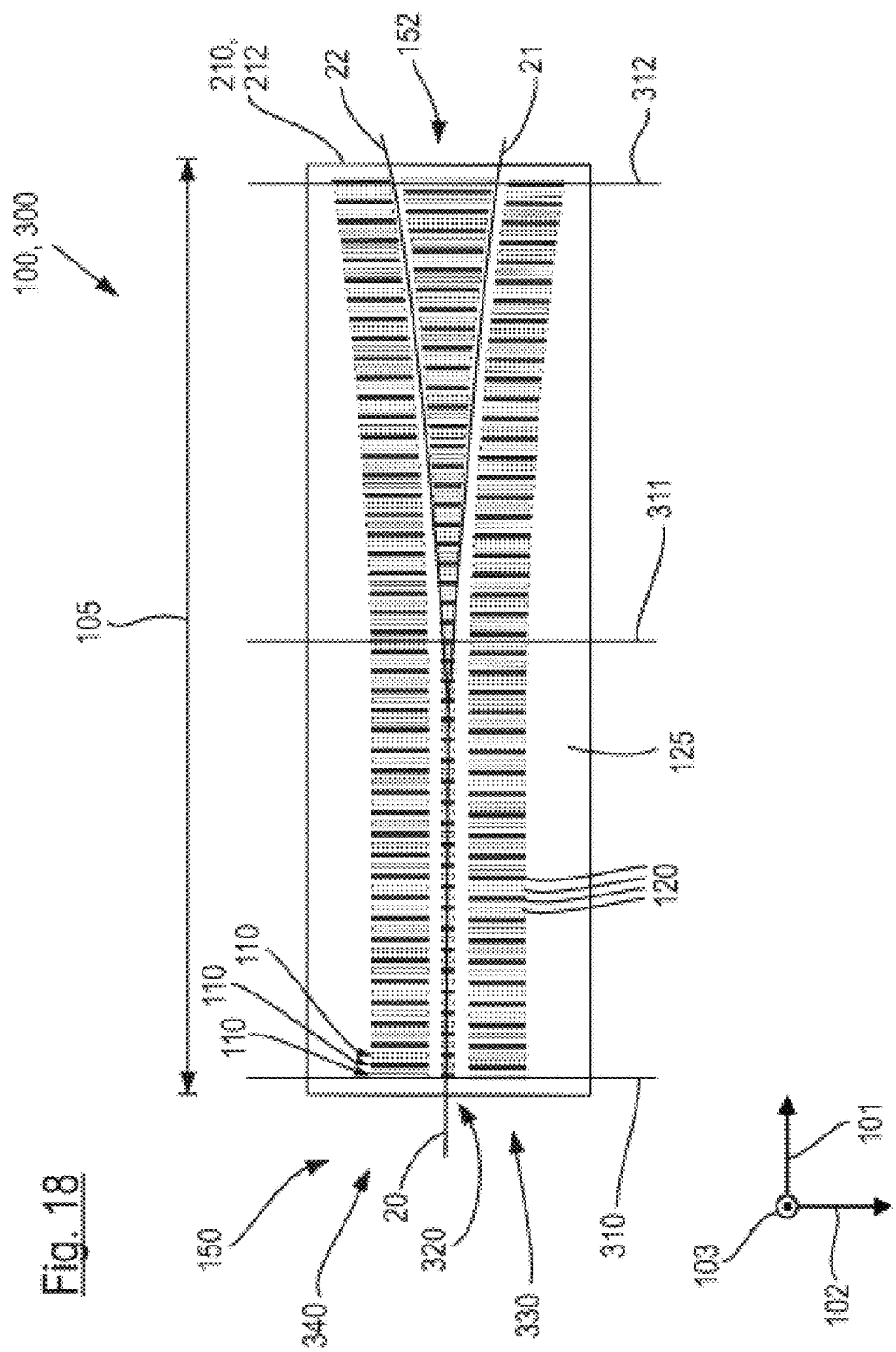

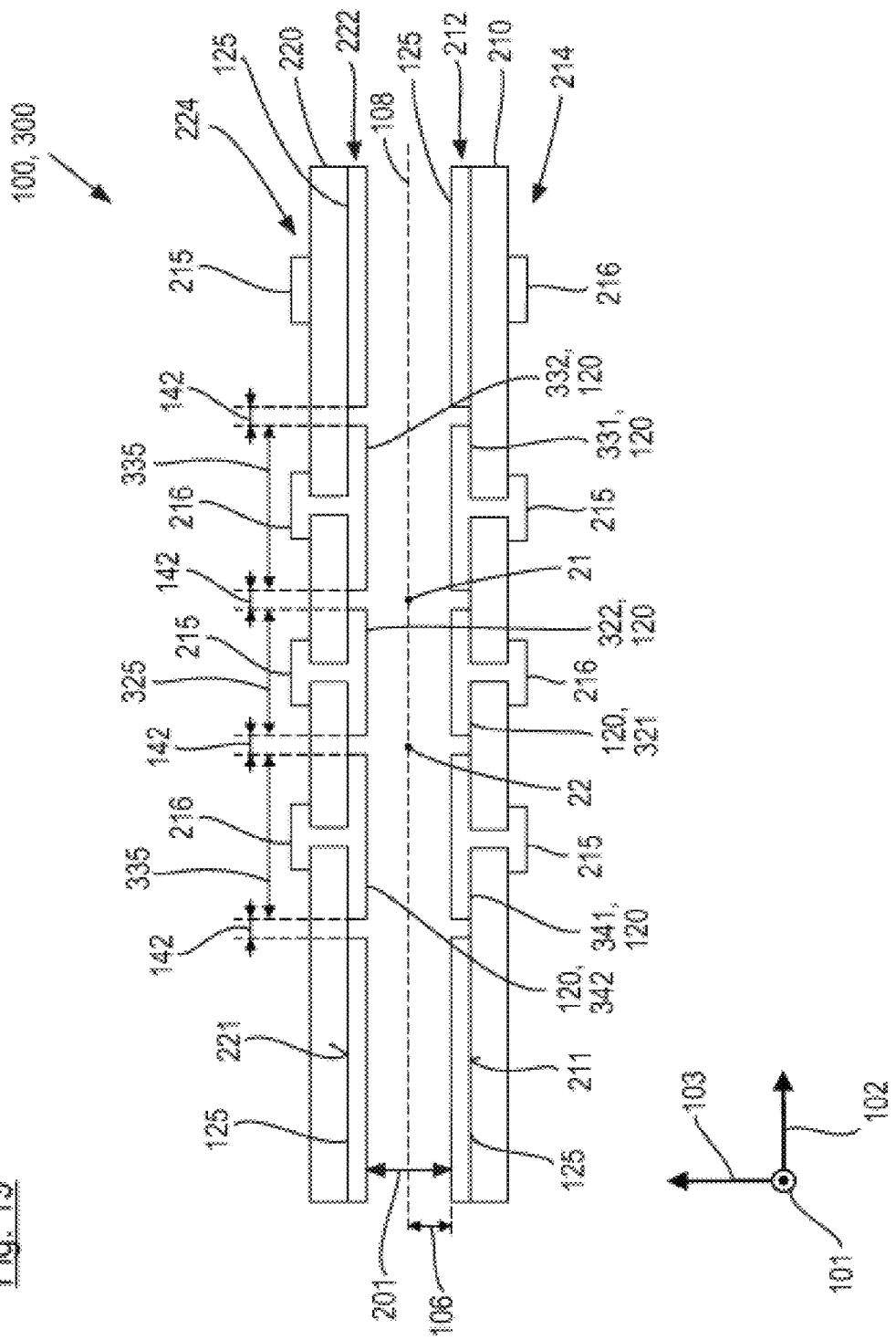

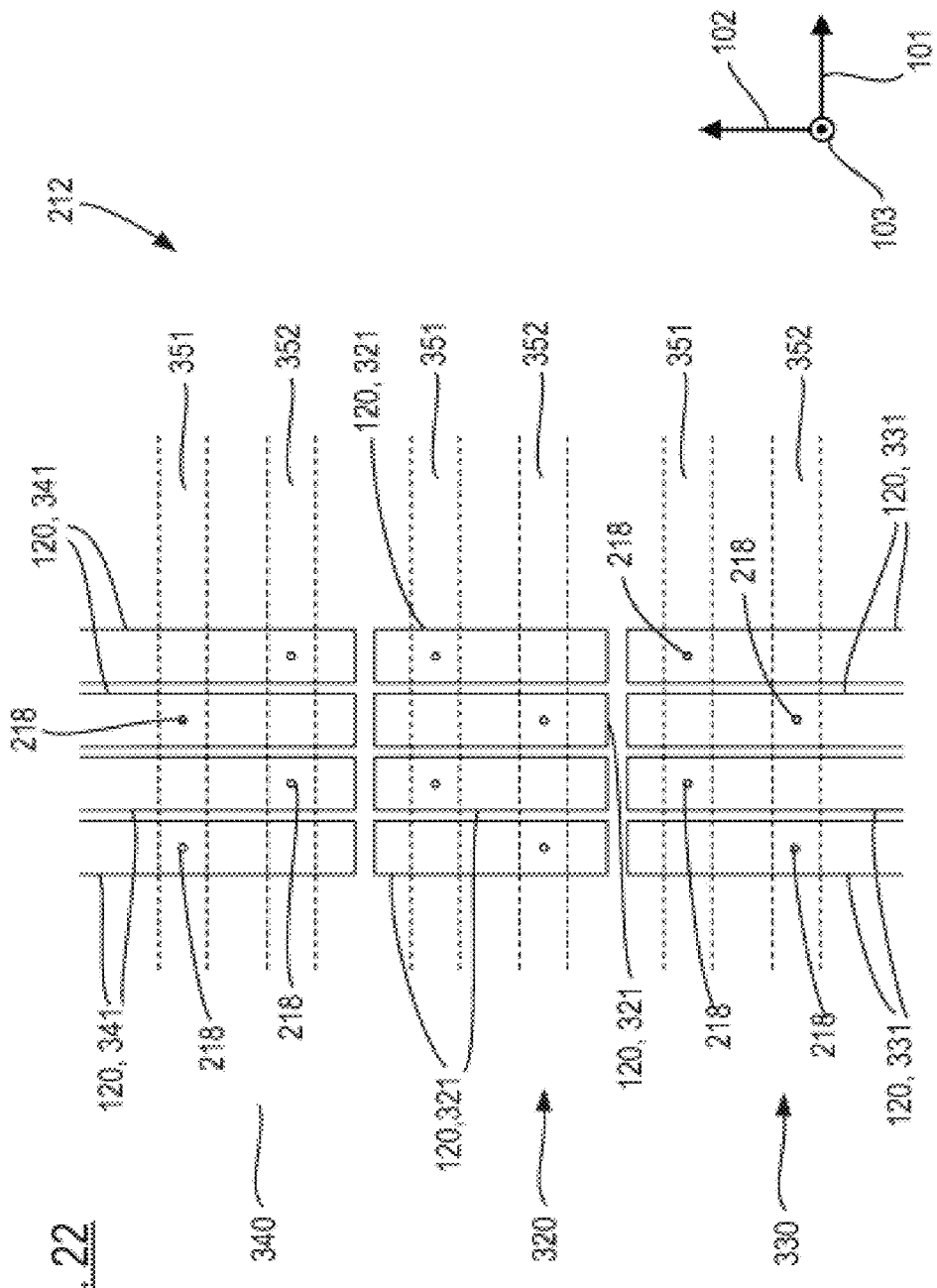

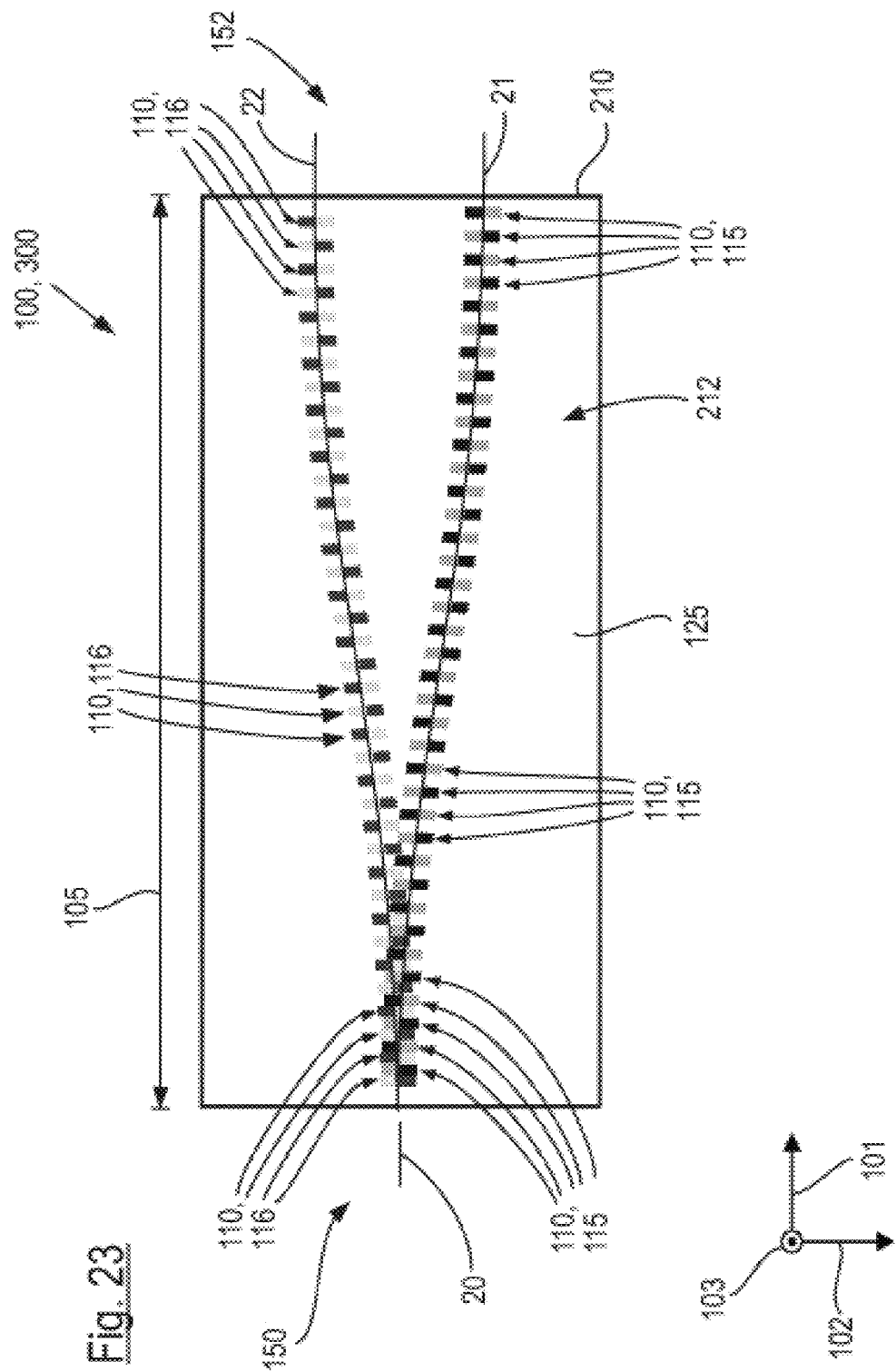

ELECTRODE STRUCTURE FOR GUIDING A CHARGED PARTICLE BEAM

CROSS-REFERENCE TO RELATED APPLICATIONS

This application is a U.S. National Phase application under 35 U.S.C. 371 of International Application No. PCT/EP2021/060958, filed on Apr. 27, 2021, which claims the benefit of German Patent Application No. 10 2020 111 820.1, filed on Apr. 30, 2020. The entire disclosures of the above applications are incorporated herein by reference.

FIELD

The present invention relates to an electrode structure for guiding a beam of charged particles, for example an electron beam, to a system comprising such an electrode structure, and to a method of guiding a beam of charged particles. The invention in particular relates to an electrode structure, to a system, and to a method by which a beam of charged particles can be transversely confined along a longitudinal path.

BACKGROUND

This section provides background information related to the present disclosure which is not necessarily prior art.

Electrode structures, which guide a beam of charged particles in a transversely confined manner along a path, are inter alia used in mass spectroscopy, laser spectroscopy, or for the implementation of quantum computers. Such electrode structures are typically configured as linear Paul traps that confine charged particles transversely in a temporally oscillating inhomogeneous electric field. The electric field used for the transverse confinement is in this respect generated by longitudinally extended electrodes, for example by longitudinally extended rods, to which a high-frequency AC voltage is applied.

As long as the particles can only follow the high-frequency oscillations of the electric field with a delay due to their mass inertia and the gradient of the electric field in the transverse directions does not become too large, the charged particles perform a fast oscillation (micromotion) with the frequency of the applied AC voltage in the inhomogeneous alternating field of a Paul trap and perform a significantly slower drift motion (secular motion) in the inhomogeneous electric field, with the slow secular motion dominating on average over time. In this respect, the secular motion always takes place in that direction in which the magnitude of the electric field decreases the most so that a confinement of the charged particles is possible in all the transverse directions at those locations at which the field magnitude of the inhomogeneous alternating field has a minimum.

If the permitted amplitude of the micromotion and thus the stability of the overall particle motion are defined, the strength of the transverse confinement of the charged particles in a linear Paul trap is proportional to the frequency and amplitude of the alternating electric field. A strong transverse confinement therefore requires high frequencies and amplitudes. This in particular applies to lightweight particles, for example electrons, that quickly react to time changes of the electric field and therefore require even higher frequencies for a stable confinement than heavier particles, for example ions.

A stable confinement of lightweight particles is therefore only possible with great technical difficulties and requires alternating fields having frequencies in the high gigahertz range and powers of several 100 W. Such alternating fields can only be used for the confinement of charged particles with a great technical effort due to the power losses occurring at the trap structures and the thermal load associated therewith.

SUMMARY

This section provides a general summary of the disclosure, and is not a comprehensive disclosure of its full scope or all of its features.

It is an object of the invention to provide an electrode structure for guiding a beam of charged particles, a system comprising such an electrode structure, and a method of guiding a beam of charged particles that strongly transversely confine the beam of charged particles. At the same time, it is a goal of the present invention to be able to deflect the beam in a simple manner on a small scale.

These objects are satisfied by an electrode structure, a system, and a method in accordance with the independent claims. Further developments are respectively specified in the dependent claims.

An electrode structure for guiding a beam of charged particles, for example an electron beam, along a longitudinal path has multipole electrode arrangements that are spaced apart from one another along the longitudinal path and that have DC voltage electrodes. The electrode arrangements are configured to generate static multipole fields centered around the path in transverse planes oriented perpendicular to the longitudinal path, wherein field strengths of the static multipole fields in the transverse planes each have a local minimum at the location of the path and increase as the distance from the location of the path increases. Field directions of the static multipole fields vary periodically with a period length along the path so that the particles propagating along the path are subjected to an inhomogeneous alternating electric field due to their intrinsic movement and experience a transverse return force towards the longitudinal path on average over time.

The present invention is based on the insight that a transverse confinement of charged particles can be generated not only with an alternating electric field, but also with static electric fields if the static electric fields vary periodically along the path and the particles move along the path. In the rest frame of the particles, the static electric fields spatially changing along the path namely generate a temporally oscillating field which can generate a transverse confinement on average over time in the same manner as a dynamic alternating field of conventional multipole traps. An effective frequency at which the alternating field resulting from the spatially consecutive static fields oscillates is in this respect given by the ratio of a longitudinal speed of the particles along the path and the period length with which the multipole fields vary along the longitudinal path.

Since, in the electrode structure in accordance with the invention, the multipole electric fields used for the transverse confinement are generated solely by static electrode voltages, the technical requirements for generating the trap fields are considerably reduced compared to alternating fields. Expensive and complex high-frequency sources and high-frequency amplifiers are in particular not required for the operation of the electrode structure. Instead, the electrode voltages can be generated by simple DC voltage sources. Since the operation of DC voltage electrodes does not require an impedance-matched load, the electrical power losses at DC voltage electrodes are also significantly lower than when AC voltage electrodes are used and high electrode voltages can be generated in a significantly simpler manner by the DC voltage electrodes in accordance with the invention than by AC voltage electrodes. For example, for an electrode voltage of 1 kV, which can be generated by open DC voltage electrodes without a greater effort using a conventional high voltage source, an AC power of 20 kW would be required for an impedance-matched termination with 50 ohms.

To generate a periodic variation of the field directions of the static multipole fields, the electrode structure can have DC voltage electrodes of the individual electrode arrangements arranged behind one another along the longitudinal path. In this respect, the electrode structure can comprise at least one row of DC voltage electrodes extending along the longitudinal path. The electrode structure can in particular comprise four or six rows of DC voltage electrodes extending in parallel with the path.

The DC voltages of the individual rows applied to the individual DC voltage electrodes can vary periodically, for example, alternate periodically. Within the period length, two DC voltage electrodes can in this respect, for example, be arranged per row that are alternately supplied with a first second electrode voltage and a second electrode voltage and that have opposite polarities with respect to a reference potential, for example with respect to ground. DC voltage electrodes that are arranged transversely next to one another in rows extending in parallel can likewise alternately have the first and second electrode voltage. A mean value of the first and second electrode voltage can be 0 V so that the first and second electrode voltage have different polarities and the charged particles are subjected to an alternating field oscillating about the ground potential of 0 V due to their intrinsic movement. Alternatively, the mean value of the first and second electrode voltage can also be different from zero.

The DC voltage electrodes of the individual electrode arrangements can be arranged disposed opposite one another in a first direction around the path. In this respect, it is in particular possible that no DC voltage electrodes are arranged laterally next to the path in a second direction oriented perpendicular to the first direction. This makes it possible to laterally displace the DC voltage electrodes of consecutive electrode arrangements in the second direction and thereby to curve the path in the second direction. Alternatively, the DC voltage electrodes can also only be arranged at one side of the path or surround the path at all sides.

The DC voltage electrodes can each have the same longitudinal electrode length in parallel with the longitudinal path. A base surface of the DC voltage electrodes formed in the conductor layer can be bounded along the longitudinal path, in each case by sides extending in parallel with the path. Furthermore, the base surfaces can be bounded in the longitudinal direction by two sides that are disposed opposite one another and that are oriented perpendicular to the path. For example, the base surfaces of the DC voltage electrodes of individual electrode arrangements can be rectangular, for instance in sections in which the longitudinal path extends in a straight manner.

The electrode arrangements can generate multipole fields in the transverse planes, the dominant components of said multipole fields corresponding to a quadrupole field or a hexapole field or higher-order multipole fields. In this respect, the dominant component of the generated multipole fields can also vary along the path, which enables a particularly pronounced structuring of the potential transversely confining the particles. The multipole fields generated can also be formed as mixed fields in which multipole components of at least two or more multipole orders are substantially equal in strength and differ from one another by, for example, less than 20%, less than 10%, less than 5%, or less than 1%.

In general, the individual multipole electrode arrangements each form multipole lenses having a longitudinally periodic polarity, for example, a longitudinally alternating polarity. The multipole lenses can, for example, be quadrupole lenses or hexapole lenses. The electrode arrangements accelerate the charged particles in the transverse planes in each case along at least one spatial axis towards the path and along at least one further spatial axis away from the location of the path. Due to the periodic variation of the electrode voltages of the DC voltage electrodes along the path, the polarity of the generated multipole lenses changes in each case so that the charged particles experience periodically changing accelerations in each spatial direction.

To generate a stable confinement of the charged particles perpendicular to the longitudinal path, the electrode voltages can be adapted to the dimensions of the DC voltage electrodes and to the speed of the charged particles such that a stability parameter derived from a harmonic component of the alternating electric field defines a working point within the stability range of a linear multipole trap, for example, of a linear quadrupole trap.

The stability range of an ideal linear quadrupole trap is inter alia described in Section II.A. of the publication by Leibfried et al: "*Quantum dynamics of single trapped ions*", Rev. Mod. Phys., vol. 75, p. 281 ff., 2003. The stability parameter of an ideal linear quadrupole trap, said stability parameter being derived from the alternating electric field, thereby results as $$q_{AC} = \frac{2Q \cdot 2U_{AC}}{M \cdot R^2 \cdot \Omega^2},$$

where Q is the charge of the particles, M is their mass, $2U_{AC}$ is the amplitude of the AC voltage applied to the electrodes, $\Omega$ is the frequency of the AC voltage, and R is the spacing of the quadrupole electrodes from the location of the longitudinal path.

The stability parameter $q_{AC}$ is derived from an ideal transverse quadrupole field with field amplitudes $$E_x = -\frac{2U_{AC}}{R^2}x, \; E_z = \frac{2U_{AC}}{R^2}z, \; E_y = 0,$$

where x, z are the coordinates in the transverse plane and y is the coordinate along the longitudinal path. Such an ideal quadrupole field is generated by the linear quadrupole trap outlined in FIG. 1 having hyperbolic electrodes.

It has been recognized within the framework of the invention that this stability parameter can be applied to the present electrode structure if $U_{AC}$ is replaced by half the voltage difference $U_{DC}$ of the static electrode voltages and the frequency $\Omega$ is specified as $$\Omega = 2\pi \frac{v_l}{L_p}.$$

In this respect, $v_l$ designates the longitudinal speed of the particles and $L_P$ designates the period length with which the electrode voltages of the DC voltage electrodes vary along the longitudinal path. In addition, a scaling with a geometry factor $\eta<1$ is to take place, said geometry factor describing the deviations of the multipole field generated by the DC voltage electrodes from a longitudinally homogeneous ideal quadrupole field.

For the present electrode structure, the stability parameter of the alternating field generated by the intrinsic movement of the electrons then results as $$q_{DC} = \eta \frac{2Q \cdot L_P^2 \cdot 2 \cdot U_{DC}}{4\pi^2 \cdot M \cdot R^2 \cdot v_l^2},$$

where R is the minimum path spacing of the longitudinal path from the DC voltage electrodes.

If the charged particles were accelerated with an acceleration voltage $U_A$ before being fed into the electrode structure, their longitudinal speed thus amounts to $v_l = \sqrt{2 \cdot QU_A/M}$. In this case, the stability parameter $q_{DC}$ can also be written as $$q_{DC} = \frac{\eta \cdot L_P^2 \cdot U_{DC}}{2\pi^2 \cdot R^2 \cdot U_A}$$

To calculate the geometry factor $\eta$, the square of the absolute value of the electric field, which the DC voltage electrodes generate in the transverse planes oriented perpendicular to the path, is averaged over a period length $L_P$ and compared with the square of the time-averaged field magnitude of the electric field $E_x$, $E_y$, $E_z$ of the ideal linear quadrupole trap. For this purpose, the square of the absolute value, averaged over the period length $L_P$, of the electric field of the DC voltage electrodes in transverse planes oriented perpendicular to the path can be approximated around the location of the longitudinal path with a quadratic function of the form $$|E|^2 = \eta^2 \frac{4U_{DC}^2}{R^4}(x^2 + z^2).$$

To establish a stable transverse confinement of the charged particles, in the electrode structure in accordance with the invention, the period length $L_P$, the minimum spacing R of the path from DC voltage electrodes, and the DC voltage $U_{DC}$ applied to the DC voltage electrodes are adapted to the longitudinal speed $v_l$ of the guided particles such that the stability parameter $q_{DC}$ adopts a value that defines a working point within the stability range of a linear quadrupole trap. The stability range and its dependence on $q_{DC}$ are inter alia described in Section II.A and FIG. 1b) of the above-mentioned publication by Leibfried et al. For electrode arrangements that generate a pure alternating field on average over time without a superposed DC voltage field, the stability range includes all the values $0<q_{DC}\leq 0.92$.

The transverse movement of the charged particles can also be described in the environment of the path by a ponderomotive return force towards the path. In general, such a ponderomotive force describes the time-averaged drift motion of charged particles in an oscillating inhomogeneous alternating electromagnetic field. It is given by the low-frequency portion of the force which a spatially inhomogeneous high-frequency electromagnetic field exerts on a charged particle. The ponderomotive force is proportional to the transverse gradient of the time-averaged field magnitude and can be described by a scalar ponderomotive potential $$\Psi = \frac{Q^2 \langle E^2 \rangle}{4 \, M \, \Omega^2},$$

where $\langle E^2 \rangle$ designates the field strength of the electric field averaged over an oscillation period. For the electrode structures in accordance with the invention, $\langle E^2 \rangle$ is given for each point of the transverse planes oriented perpendicular to the path by a mean value of the square of the absolute value of the electric field, wherein the mean values are formed over a period length $L_P$ in the longitudinal direction.

A stable confinement of the charged particles along the longitudinal path is then achieved in the electrode structure in accordance with the invention in that the field magnitude or the field strengths of the static multipole fields generated by the electrode arrangements have a local minimum at the location of the path. This has the result that the ponderomotive potential also has a local minimum at the location of the path, in which local minimum the charged particles are confined by the transverse return force oriented towards the path.

The ponderomotive potential is independent of the sign of the charge of the charged particles. In this regard, the charged particles guided in the electrode structure can both be negatively charged particles, for example electrons, and positively charged particles, for example ions. The electrode structure can in particular be used in an electron microscope to guide an electron microscopy beam.

The multipole fields generated by the electrode arrangements can, in the lowest order, also have a higher-order multipole component instead of a quadrupole component. For these cases, the stability parameter of the alternating field, as inter alia described in D. Gerlich: "*Inhomogeneous RF fields: a versatile tool for the study of processes with slow ions*" in Advances in Chemical Physics: State-selected and state-to-state ion-molecule reaction dynamics. Part 1. Experiment, vol. 82, John Wiley & Sons, 1992, pp. 42, can be generalized to $$q_n = \frac{2n(n-1)QU_{AC}}{M\Omega^2 R^2},$$

where n is the order of the multipole field. For an alternating field, which in accordance with the invention is generated by the intrinsic movement of the particles, the following then results $$q_n = \frac{2n(n-1)QU_{AC}}{M\Omega^2 R^2} = n(n-1)\frac{\eta \cdot L_P^2 \cdot U_{DC}}{4\pi^2 \cdot R^2 \cdot |U_A|}.$$

Consequently, in the electrode structure in accordance with the invention, the period length $L_P$, the minimum spacing R of the path from DC voltage electrodes, and the DC voltage $U_{DC}$ applied to the DC voltage electrodes can generally be adapted to the longitudinal speed $v_l$ of the guided particles such that the stability parameter $q_n$ adopts a value that defines a working point within the stability range of an nth-order linear multipole trap. In this respect, n can be the lowest or dominant multipole order of the static multipole fields generated by the electrode arrangements.

The electrode arrangement can be configured to transversely stably confine all the charged particles whose longitudinal energy $E_{kin}=Q \cdot U_A$ corresponds to an acceleration voltage $U_A$ between 0 V and 500 kV, for example, between 0 V and 100 kV; 0 V and 50 kV; 0 V and 30 kV; V and 10 kV; 0 V and 5 kV; or 0 V and 1 kV. Alternatively or additionally, $U_A$ can also amount to at least 1 V, at least 10 V, at least 100 V, or at least 1 kV.

The electrode arrangement can guide the beam of charged particles in a transversely confined manner over a length of at least 0.1 mm, 1 mm, 10 mm, 50 m, or 100 mm and/or at most 300 mm, 500 mm, or 1000 mm.

The electrode arrangements can be configured to transversely confine the beam of charged particles along the full length of the electrode structure. In this respect, the electrode arrangements can guide the beam as a single beam. In this case, all the charged particles that are guided along the longitudinal path exit the electrode arrangement at the same point. The longitudinal path can, for example, be curved in one or two transverse directions.

Alternatively, the electrode arrangements, in particular the shape and/or the spacing and/or the number of DC voltage electrodes of the individual electrode arrangements, can change along the longitudinal path such that the transverse potential generated by the electrode arrangements exhibits structural changes along the path. For example, the number of local minima of the electric field strength of the multipole fields can change along the path so that the path splits transversely into two or more partial paths and the charged particles entering the electrode structure are divided into at least a first and a second portion and, for example, exit the electrode structure at different positions.

The multipole fields can in particular vary in transverse planes, which are spaced apart with the period length, along the path, wherein, for example, a lowest and/or dominant order of the multipole fields and/or a strength of the multipole fields varies/vary. This enables a particularly simple structural change of the transverse potential generated by the electrode arrangements. The change of the multipole fields in transverse planes, which are spaced apart from one another with the period length, is in this respect superposed on the periodic variation of the field directions of the static multipole fields. The change can take place over a change length that is greater than the period length with which the field directions of the static multipole fields vary periodically. For example, the change length can be at least five times, at least ten times, at least 20 times, or at least 50 times greater than the period length. Alternatively or additionally, a radius of curvature of a curvature of the longitudinal path resulting from the change can be larger than a minimum radius of curvature, wherein a centrifugal force acting on the charged particles at the minimum radius of curvature corresponds to the transverse return force in the ponderomotive potential that acts on the charged particles on average over time.

In accordance with an embodiment, the electrode structure comprises electrode arrangements formed as a junction, wherein the electrode arrangements of the junction vary along the path such that the path can be split into a first partial path and a second partial path so that a first portion of the charged particles can be guided along the first partial path and a second portion of the charged particles can be guided along the second partial path. By means of the junction, the charged particles are in particular guided in a transversely confined manner along the first and second partial paths so that a loss-free splitting of the particle beam is made possible. Since the transverse confinement of the charged particles takes place through static electric fields and such static fields do not have any effects on a quantum mechanical coherence of the particle beam, the beam of charged particles can furthermore be coherently split.

The partial paths can be split in the region of the junction at an angle of at most 1°, at most 0.6°, at most 0.1°, at most 0.05°, at most 0.01°, or at most 0.005°. The smaller the angle at which the partial paths split, the smaller the excitations which the charged particles experience in the transverse ponderomotive potential, and thus the smaller the losses in the region of the junction.

In accordance with an embodiment, a dominant multipole component of the static multipole fields of the electrode arrangements is formed by a quadrupole component at an input side of the path and/or at respective output sides of the partial paths in the transverse planes. The dominant multipole component can be determined by a multipole expansion of the electric field in the transverse planes and is given by the lowest multipole tensor different from zero, i.e. by the quadrupole tensor of the multipole expansion in the case of a quadrupole component. Since the transverse curvature of the electric field, and thus also the strength of the time-averaged return force of the ponderomotive potential, decreases as the multipole order increases and a quadrupole field is the field of the lowest multipole order with a field minimum at the center, the charged particles are transversely particularly strongly confined in the case of a dominant quadrupole component.

In accordance with an embodiment, the electrode arrangements each comprise three DC voltage electrodes that are arranged next to one another in a transverse direction and that have an inner electrode and two outer electrodes arranged at both sides of the inner electrode, wherein the inner and outer electrodes of the individual electrode arrangements form three electrode rows extending along the longitudinal path and a transverse width of the inner electrodes increases along the longitudinal path.

With such electrode arrangements, a transverse trap minimum centered around the longitudinal path at the input side can easily be split into two separate transverse trap minima centered around the first and second partial paths. The increase in the transverse width of the inner electrode in this respect leads to a continuously increasing transverse spacing of the two partial paths.

In accordance with an embodiment, the junction is configured to simultaneously split the incoming charged particles into the first and second portions of charged particles and to simultaneously guide the first portion of charged particles along the first partial path and the second portion of charged particles along the second partial path. Such a junction therefore forms a beam splitter for the charged particles guided along the path. With such a junction, the beam of charged particles can, for example, be uniformly split into a first portion and a second portion.

Since the junction is implemented completely by static electric fields, the particle beam can in particular be coherently split quantum mechanically so that the quantum mechanical wave functions of the charged particles propagating along the first and second partial paths have a fixed phase relationship with one another. Furthermore, from a quantum mechanical point of view, such a junction can form an amplitude beam splitter in which the quantum mechanical wave functions of the particles in the two partial paths, in particular their amplitudes and phases, are determined solely by the geometry of the transverse ponderomotive potential and the wave functions of the exiting particles are independent of the coherence properties of the particles entering the junction.

In order, in the case of an amplitude beam splitter, to obtain the quantum mechanical state of motion of the particles in the transverse ponderomotive potential during the splitting, the angle at which the partial paths split can in particular be selected in dependence on the longitudinal speed of the particles such that the energy of the transverse excitation in the region of the junction is less than an energy difference of quantum states in the transverse ponderomotive potential, for example less than an energy difference between the two lowest-energy quantum states of the ponderomotive potential.

A junction, which splits the beam of charged particles into the first and second portions at the same time, can, for example, be implemented with the electrode arrangements whose DC voltage electrodes are arranged in the three electrode rows extending along the longitudinal path and in which the transverse width of the inner electrodes increases along the longitudinal path. For this purpose, the outer electrodes of the individual electrode arrangements can each have the same electrode voltage, wherein the electrode voltage of the outer electrodes differs from the electrode voltage of the inner electrode.

In accordance with a further development of the junction, a dominant multipole component of the static multipole fields of the electrode arrangements is formed by a hexapole component in at least one transverse plane. A hexapole field is the lowest-order multipole field by which a point of intersection of the ponderomotive potential, at which the longitudinal path splits into the first and second partial paths, can be implemented. Compared to a junction that is based on higher-order multipole components, the charged particles in a junction implemented by means of a hexapole field are thereby particularly strongly transversely confined and are therefore particularly little transversely excited during the splitting.

In accordance with an embodiment, the junction is configured to selectively guide the incoming charged particles either as the first portion along the first partial path or as the second portion along the second partial path. The junction can therefore be operated as a kind of switch. In this case, the first portion of the charged particles guided along the first partial path and the second portion of the charged particles guided along the second partial path are formed by portions of a beam of charged particles entering the electrode structure, said portions propagating after one another in time along the longitudinal path. A junction configured as a switch makes it possible to guide the charged particles in a targeted manner along the first or second partial path. In this respect, the partial paths can be components of a larger, branched network of individual paths along which the charged particles are guided and can interact with one another, for example, interact with one another quantum mechanically. Such targeted interactions are, for example, required to implement quantum computers.

If the electrode structure has the DC voltage electrodes arranged next to one another in three rows, the junction configured as a switch can, for example, be implemented in that the inner electrodes of the individual electrode arrangements can selectively be supplied with the DC voltages of the outer electrodes at a first side of the inner electrodes or by the DC voltages of the outer electrodes at a second side of the inner electrodes disposed opposite the first side.

In accordance with a further development, the static multipole fields generated by the electrode arrangements vary along the path such that only first charged particles and not second charged particles experience a stable confinement along the path, wherein the first charged particles have a first longitudinal speed and the second charged particles have a second longitudinal speed different from the first speed. Thus, the electrode arrangements act as an energy filter that allows only the first charged particles to pass through. In this regard, the present invention generally also relates to a use of the described electrode structure or its further developments as an energy filter for charged particles guided along a longitudinal path.

As follows from the above representation of the stability parameter $$q_{DC} = \frac{\eta \cdot L_P^2 \cdot U_{DC}}{2\pi^2 \cdot R^2 \cdot U_A},$$

the stability of the particle trajectories, unlike in conventional multipole traps, does not depend on the charge-to-mass ratio of the charged particles, but solely on the acceleration voltage $U_A$ and thus on the longitudinal energy of the charged particles. The multipole electric fields can alternate along the longitudinal path by a mean multipole field of zero. In this case, the electrode arrangement acts as a high-pass filter that conducts high-energy charged particles, but not low-energy charged particles. In this respect, the electrode arrangements merely conduct charged particles with energies that result from acceleration voltages $U_A$ to which $q_{DC} \leq 0.92$ applies.

In a further development, the multipole fields alternate along the path by a mean multipole field different from zero so that the particles guided along the path are subjected to an inhomogeneous static superposition field, which is defined by the mean multipole field, in addition to the inhomogeneous alternating electric field and only the first charged particles and not the second charged particles perform a stable transverse oscillation along the path. In particular, the mean multipole field can be a quadrupole field in a first approximation.

Such a static superposition field would correspond to a bias of the longitudinal electrodes with a static multipole voltage in the case of a linear multipole trap, for example, with a static quadrupole voltage in the case of a linear Paul trap. Such a bias reduces the value range of $q_{DC}$, in which the charged particles perform stable oscillations around the trap center, at high particle energies. An electrode arrangement in which the multipole fields oscillate around a multipole field different from zero therefore acts as a bandpass filter that only transmits charged particles with longitudinal energies from a value range restricted at both sides.

In this respect, a first stability parameter derived from the alternating field and a second stability parameter derived from the superposition field can define an operating point within the stability range of a linear multipole trap, for instance a linear quadrupole trap, for the first charged particles and can define an operating point outside the stability range of the linear multipole trap for the second charged particles. In this respect, the first stability parameter corresponds to the stability parameter $q_{DC}$, while the second stability parameter, derived from the superposition field, for a quadrupole trap is given by $$a_{DC} = \frac{\eta \cdot L_P^2 \cdot U_0}{\pi^2 \cdot R^2 \cdot U_A}.$$

In this respect, $U_0$ designates the mean value by which the electrode voltages alternate along the longitudinal path.

The second stability parameter $a_{DC}$ of the quadrupole trap can be generalized to an nth-order multipole field in the same manner as the first stability parameter $q_{DC}$ and is then given by $$a_n = \frac{4n(n-1)QU_0}{M\Omega^2 R^2} = n(n-1)\frac{\eta \cdot L_P^2 \cdot U_0}{2\pi^2 \cdot R^2 \cdot |U_A|}.$$

At predefined values for $U_{DC}$ and $U_0$, the stability parameters and thus the operating point of the electrode structure only depend on the longitudinal energy of the particles or the acceleration voltage $U_A$. In this respect, all the operating points for a predefined ratio $U_0/U_{DC}$ lie on a line through the origin in the stability diagram. By adapting the ratio $U_0/U_{DC}$, the gradient of this straight line and thus the pass band of the implemented energy filter can be varied. The values of $U_{DC}$ and $U_0$ can in this respect be selected such that the line through the origin given by the ratio $U_0/U_{DC}$ intersects the stability range only over a predefined length or, within the framework of measurement accuracy, only at a single point. For example, this point lies at $q_{DC}$=0.706 and $a_{DC,max}$=0.237 in the case of multipole fields formed as quadrupole fields in a first approximation. This then has the result that only charged particles whose longitudinal energies lie in a predefined value range or correspond to a predefined value pass through the electrode structure along the longitudinal path. The predefined value range or the predefined value can in this respect be changed by varying the ratio $U_0/U_{DC}$.

In accordance with a further development, the period length of the longitudinal variation of the field directions of the static multipole fields is less than 60 mm, for example less than 10 mm, 6 mm, 1 mm, or 0.1 mm. The smaller the period length, the smaller the stability parameters $q_{DC}$, $a_{DC}$ or $q_n$, $a_n$, which results in less micromotion and thus in more stable trajectories. Furthermore, a small period length makes it possible to also stably guide the charged particles at high longitudinal energies.

In accordance with a further development, a longitudinal spacing between the individual electrode arrangements is less than 10 mm, for example less than 1 mm, 0.5 mm, 0.1 mm, 0.05 mm, or 0.01 mm. The smaller the spacings between the individual electrode arrangements, the larger the field magnitude, averaged over a period length, of the multipole fields generated by the electrode arrangements. Therefore, a decrease in the spacings leads to an amplification of the ponderomotive potential and thus also to a stronger transverse confinement of the charged particles.

In accordance with a further development, the electrode arrangements are arranged directly adjoining one another along the longitudinal path. The spacings between the individual electrode arrangements can thereby be particularly small and the transverse ponderomotive potential can be particularly large. In the case of directly adjoining electrode arrangements, the DC voltage electrodes of adjacent electrode arrangements can in particular be arranged next to one another without spacer electrodes disposed therebetween, for example without ground electrodes disposed therebetween.

In accordance with a further development, the electrode arrangements have equal spacings from one another along the longitudinal path. In the rest frame of the charged particles, the alternating electric field generated by the DC voltage electrodes then varies regularly along the path and approximates a harmonic oscillation particularly well.

In accordance with a further development, a longitudinal length of the electrode structure along the path amounts to at least 1 mm, 10 mm, or 100 mm and/or at most 300 mm, 500 mm, or 1000 mm. The electrode structure is thereby compact enough to be used in conventional electron microscopes or mass spectrometers, on the one hand, and, on the other hand, it is large enough to enable a sufficient deflection of the beam along the longitudinal path and, for example, a complete splitting of the particle beam.

In accordance with a further development, the DC voltage electrodes are formed in at least one conductor layer oriented in parallel with the path and structured along the path. This enables a simple manufacture and orientation of the DC voltage electrodes relative to one another. The arrangement of the DC voltage electrodes in such a conductor layer furthermore makes it possible to structure the potential generated by the DC voltage electrodes on a small scale. Thus, the longitudinal path can, for example, be curved in one or two transverse directions or the path can split transversely into two or more partial paths. In this regard, a junction or a beam splitter for splitting a beam of free charged particles can also be implemented in a simple manner with the present electrode structure.

The conductor layer for forming the electrodes consists of an electrically conductive material, for example, of a metal or semiconductor material. The conductor layer can, for example, comprise gold or copper, in particular at least at a surface facing the charged particles. The conductor layer can have minimum structural sizes of at most 1 mm, 100 µm, 50 µm, 10 µm, or 1 µm. For example, the width of insulating gaps between individual DC voltage electrodes can correspond to the minimum structural sizes mentioned. The conductor layer can, for example, have been structured by means of a microfabrication technique such as lithography, laser machining, or electron beam cutting.

In accordance with a further development, the DC voltage electrodes are formed in two conductor layers arranged spaced apart from one another, wherein the conductor layers are, for example, aligned in parallel with one another. Compared to a conductor layer arranged only at one side of the path, which is generally likewise possible within the framework of the invention, stronger multipole fields, and thus also a stronger transverse ponderomotive potential, can be generated with two conductor layers arranged spaced apart from one another. The conductor layers arranged spaced apart from one another can, for example, be arranged at two mutually oppositely disposed sides of the longitudinal path.

In accordance with a further development, the DC voltage electrodes of the electrode arrangements are formed with mirror symmetry with respect to one another in the two conductor layers, wherein DC voltage electrodes disposed opposite one another in the two conductor layers, for example, have opposite polarities. Such electrode arrangements generate a particularly uniform and strong multipole field. DC voltage electrodes disposed opposite one another in the two conductor layers can generally also have different electrode voltages, wherein the electrode voltages can be of the same polarity and of different polarities.

For example, the individual electrode arrangements can have two DC voltage electrodes arranged transversely next to one another in each conductor layer, wherein DC voltage electrodes arranged transversely next to one another within the individual conductor layers have different electrode voltages, for example different electrode voltages of the same magnitude and opposite polarities. In such electrode arrangements, the generated multipole field forms a quadrupole field in a first approximation, said quadrupole field generating a harmonic transverse ponderomotive potential.

Alternatively, the individual electrode arrangements in each conductor layer can also have three DC voltage electrodes arranged transversely next to one another, wherein DC voltage electrodes arranged transversely next to one another within the individual conductor layers have different electrode voltages, for example, different electrode voltages of the same magnitude and opposite polarities. In this case, the generated multipole field can form a hexapole field in a first approximation, by means of which hexapole field a point of intersection for splitting the particle beam can be implemented.

In a further development, the structured conductor layer is arranged on a surface extending in parallel with the longitudinal path, wherein the surface is, for example, a planar surface or a surface curved around the longitudinal path. This allows a particularly simple manufacture and relative alignment of the DC voltage electrodes formed in the structured conductor layer. Equally, a further conductor layer disposed opposite the structured conductor layer can be arranged on a further surface extending in parallel with the longitudinal path.

In a further development, the structured conductor layer is arranged on a carrier structure, for example, on a carrier plate or a carrier film. The carrier structure can, for example, form a substrate to which the conductor layer is applied. Coating processes by which the conductor layer can be applied to the substrate, for example, comprise a chemical or physical vapor deposition, application by a doctor blade, electroplating, or the like. The carrier structure stabilizes the conductor layer and can comprise even further conductor structures in addition to the conductor layer, for instance supply lines for contacting the DC voltage electrodes.

In a further development, a supply line, which contacts individual DC voltage electrodes of the electrode arrangements, is formed in a further conductor layer of the carrier structure, said further conductor layer extending in parallel with the conductor layer, and is connected to the DC voltage electrodes via vias extending through the carrier structure. DC voltage electrodes arranged in the proximity of the longitudinal path can thereby be contacted without disturbing or deforming the multipole fields, which are generated by the DC voltage electrodes, by the electric field of the supply lines.

In a further development, a plurality of supply lines in the further conductor layer extend in parallel with one another along the longitudinal path, wherein the supply lines are, for example, connected in an alternating manner to the DC voltage electrodes of the individual electrode arrangements. DC voltage electrodes arranged longitudinally after one another, for example DC voltage electrodes arranged longitudinally in a row, can thereby be particularly easily supplied with DC voltages whose electrode voltages vary periodically along the path.

In a further development, the DC voltage electrodes of the individual electrode arrangements can each be supplied with two oppositely polarized DC voltages. The multipole fields generated by the electrode arrangements can then be formed as symmetrical with respect to a common ground potential of the two oppositely polarized DC voltages so that the longitudinal path is then also at ground potential. The charged particles can then enter the electron structure along the longitudinal path, which is composed of field-free spatial regions lying at ground potential, without being transversely excited.

A system is furthermore specified comprising the electrode structure in accordance with the claims and an acceleration apparatus, wherein the acceleration apparatus is configured to accelerate the charged particles with a predefined acceleration voltage and subsequently to feed them along the longitudinal path into the electrode structure, and wherein the acceleration voltage and electrode voltages, which are applied to the multipole electrode arrangements, are matched to one another such that the accelerated charged particles perform a stable transverse oscillation about the location of the longitudinal path on average over time. The acceleration voltage and the electrode voltages can in particular be matched to one another such that the stability parameters $q_{DC}$ and $a_{DC}$ define an operating point within the stability range of a linear multipole trap, for example within the stability range of a linear quadrupole trap.

To generate the at least one electrode voltage applied to the DC voltage electrodes, the system can furthermore comprise one or more DC voltage sources, for example high voltage sources.

In accordance with a further development, the acceleration apparatus is configured to accelerate a plurality of types of charged particles, for example simultaneously, to the acceleration voltage and to feed them along the longitudinal path into the electrode structure. Since the stability of the particle trajectories along the longitudinal path only depends on the acceleration voltage $U_A$ with which the charged particles were accelerated before entering the electrode structure, but not on the mass or the charge-to-mass ratio of the individual charged particles, the electrode structure is configured to simultaneously guide charged particles having a different mass and/or charge in a transversely confined manner. With the present electron structure, for example, chemical reactions at low particle energies or quantum mechanical interactions involving different types of charged particles can thereby be performed.

In accordance with a further development, the system is configured as an electron microscope and the beam of charged particles is an electron microscopy beam for irradiating a microscopy object. The present invention therefore in particular also relates to the use of the electrode structure in accordance with the claims in an electron microscope. In this regard, all the advantages and further developments that are disclosed in connection with the electrode structure in accordance with the invention also relate to the use of the electron structure in an electron microscope, and vice versa.

The electrode structure in accordance with the claims, for example, allows a conventional electron microscope to be improved to the effect that the electron beam can be transversely deflected or split in a simple manner. On a splitting of the electron beam, the microscopy object can, for example, be examined with two separate coherent electron beams, wherein in particular an interaction of the microscopy object with one of the coherent electron beams can be detected based on changes of the other coherent electron beam.

A plurality of the electrode structures in accordance with the claims can also be cascaded so that charged particles exiting a preceding electrode structure enter a subsequent electrode structure. The electrode structures can each comprise junctions configured as beam splitters so that a particle beam entering the cascaded electrode structures is split into a plurality of partial beams, in particular into more than two partial beams.

A method of electrostatically guiding a beam of charged particles along a longitudinal path is further specified, wherein the method comprises the following steps:
- providing the electrode structure in accordance with the claims;
- applying electrode voltages varying periodically along the longitudinal path to the DC voltage electrodes of the electrode arrangements so that charged particles propagating along the path are subjected to an oscillating inhomogeneous alternating electric field due to their intrinsic movement and experience a transverse return force towards the longitudinal path on average over time;
- feeding the charged particles along the longitudinal path into the electrode structure; and
- guiding the charged particles along the longitudinal path by means of the transverse return force.

In this respect, all the advantages and further developments that are disclosed in connection with the electrode structure in accordance with the claims also relate to the method in accordance with the claims, and vice versa. The method can in particular comprise accelerating the charged particles with a predefined acceleration voltage. In this respect, the predefined acceleration voltage and the electrode voltages applied to the DC voltage electrodes can be matched to one another such that the stability parameters $q_n$ and $a_n$ or $q_{DC}$ and $a_{DC}$ define an operating point within the stability range of a linear multipole trap, for example within the stability range of a linear quadrupole trap.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
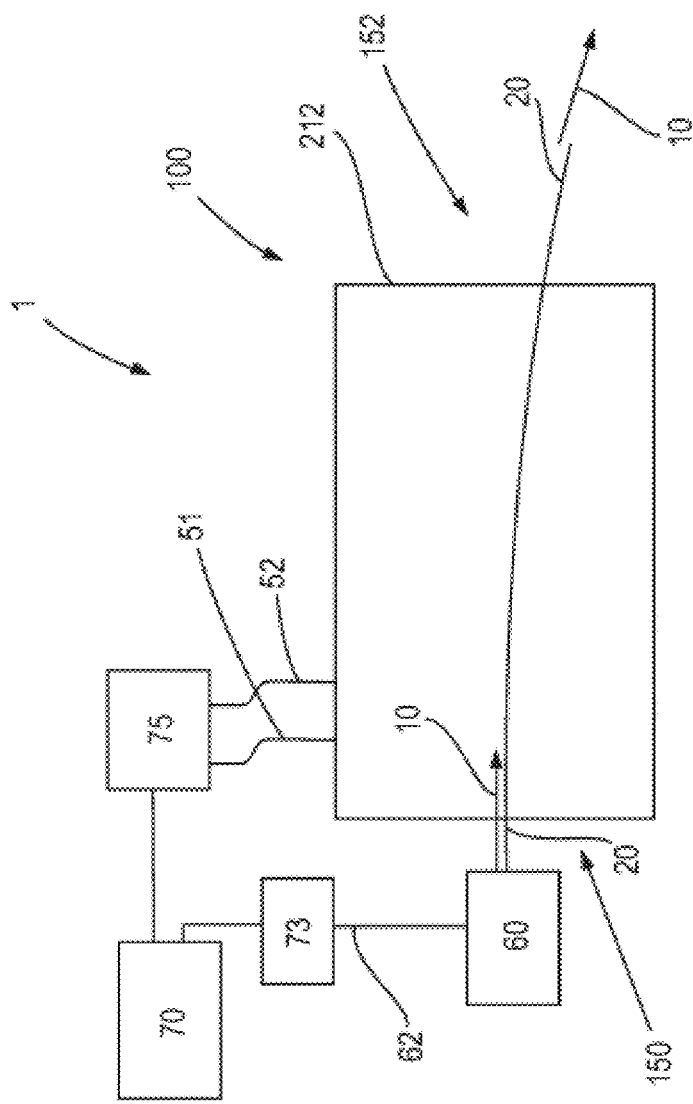
Figure 3:
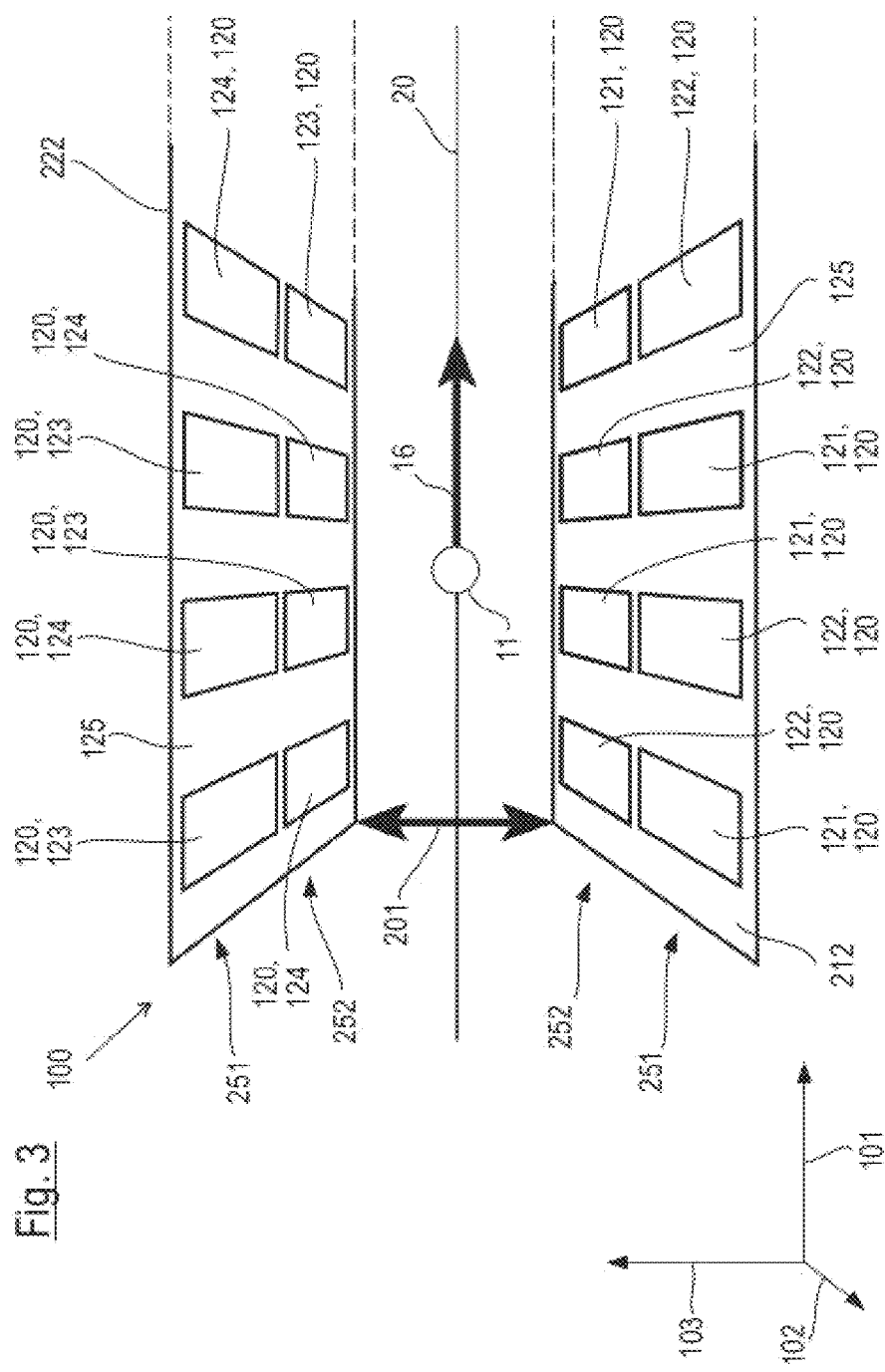
Figure 4:
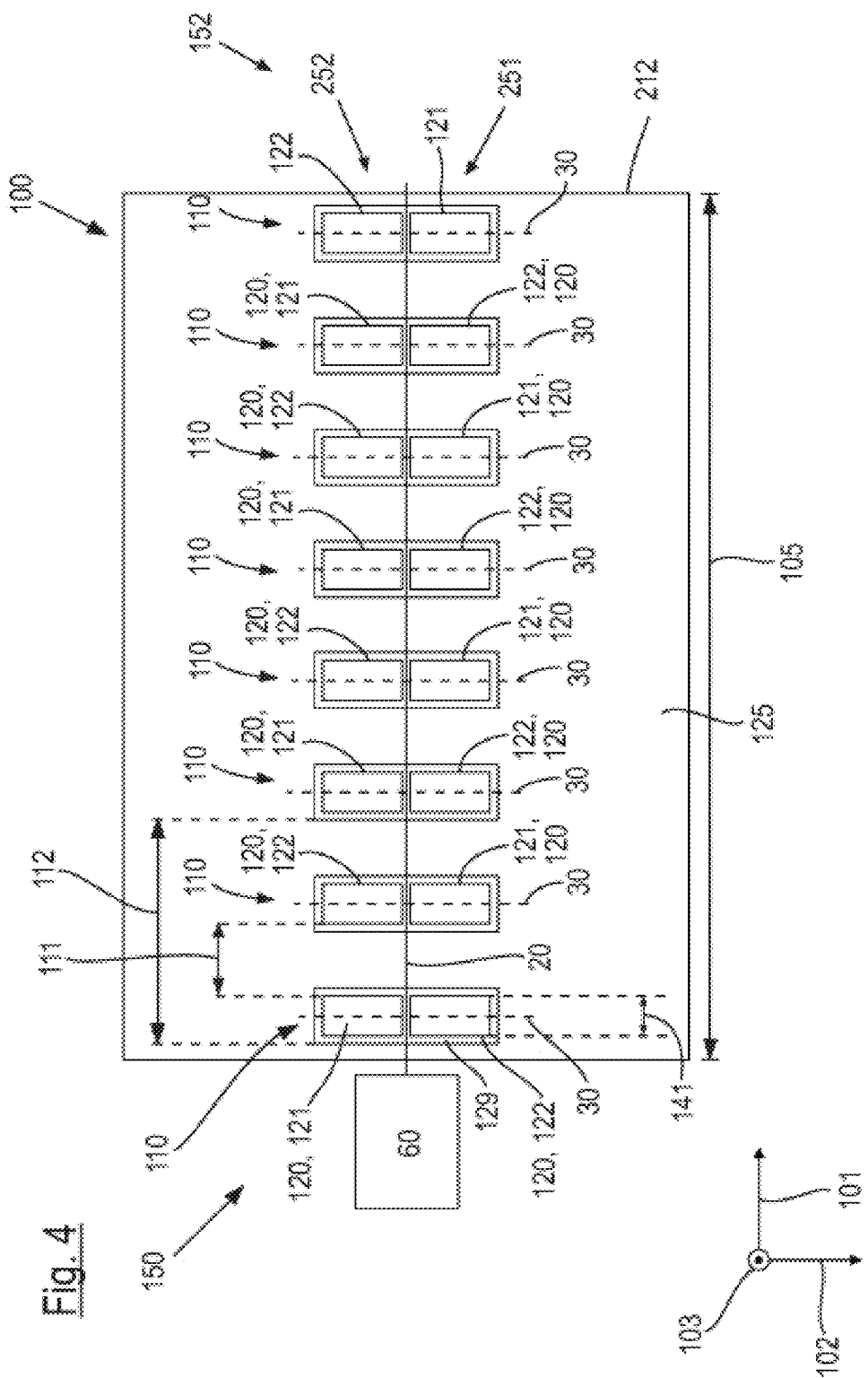
Figure 5:
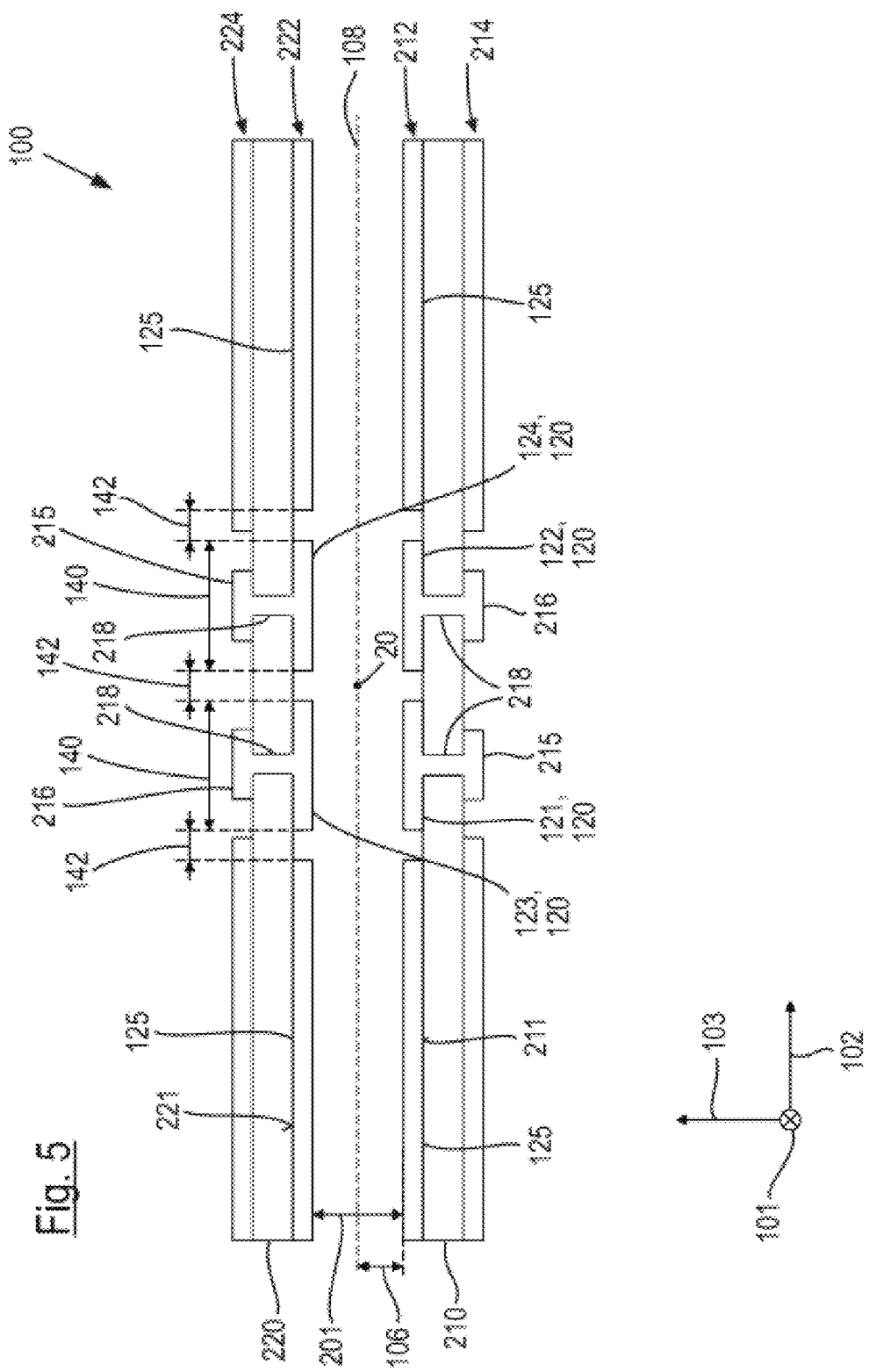
Figure 6:
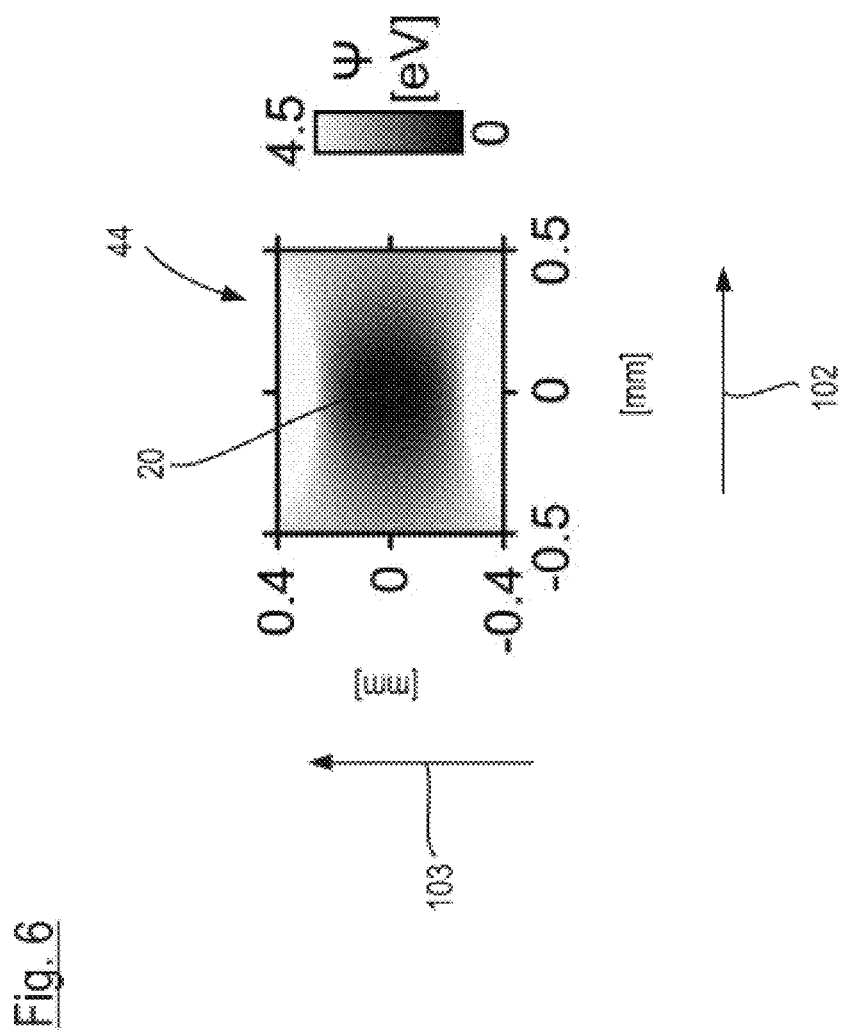
Figure 7:
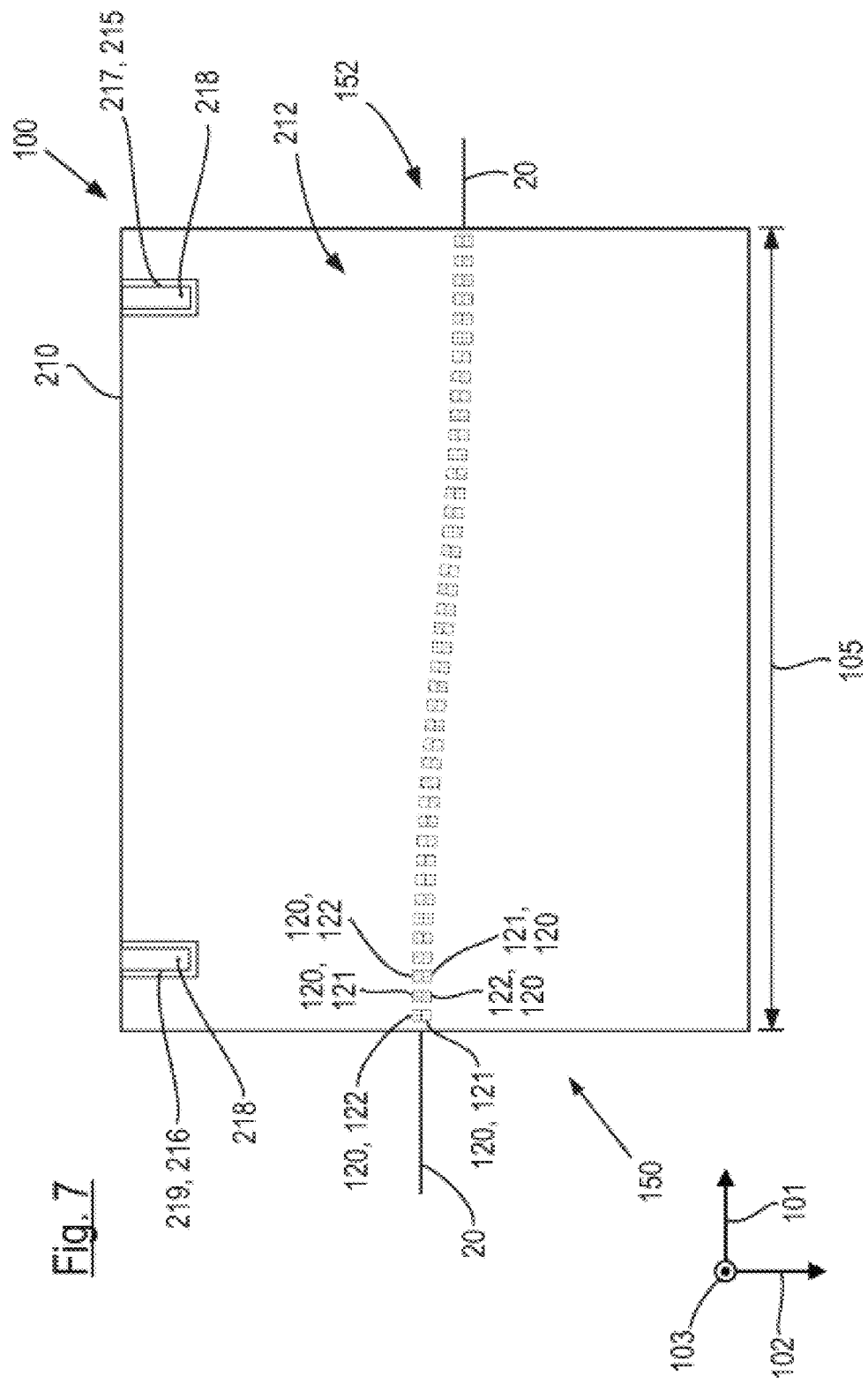
Figure 8:
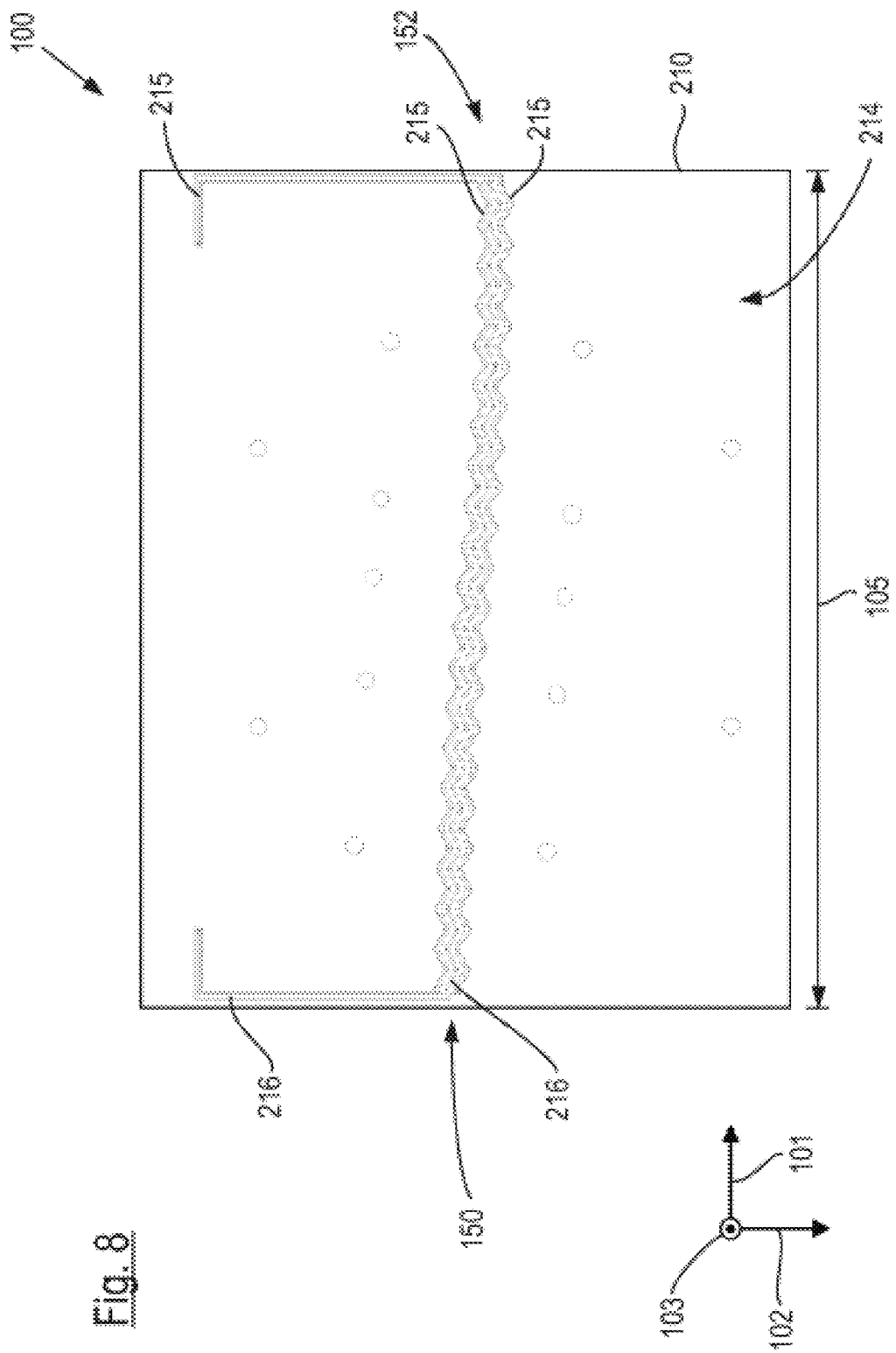
Figure 9:
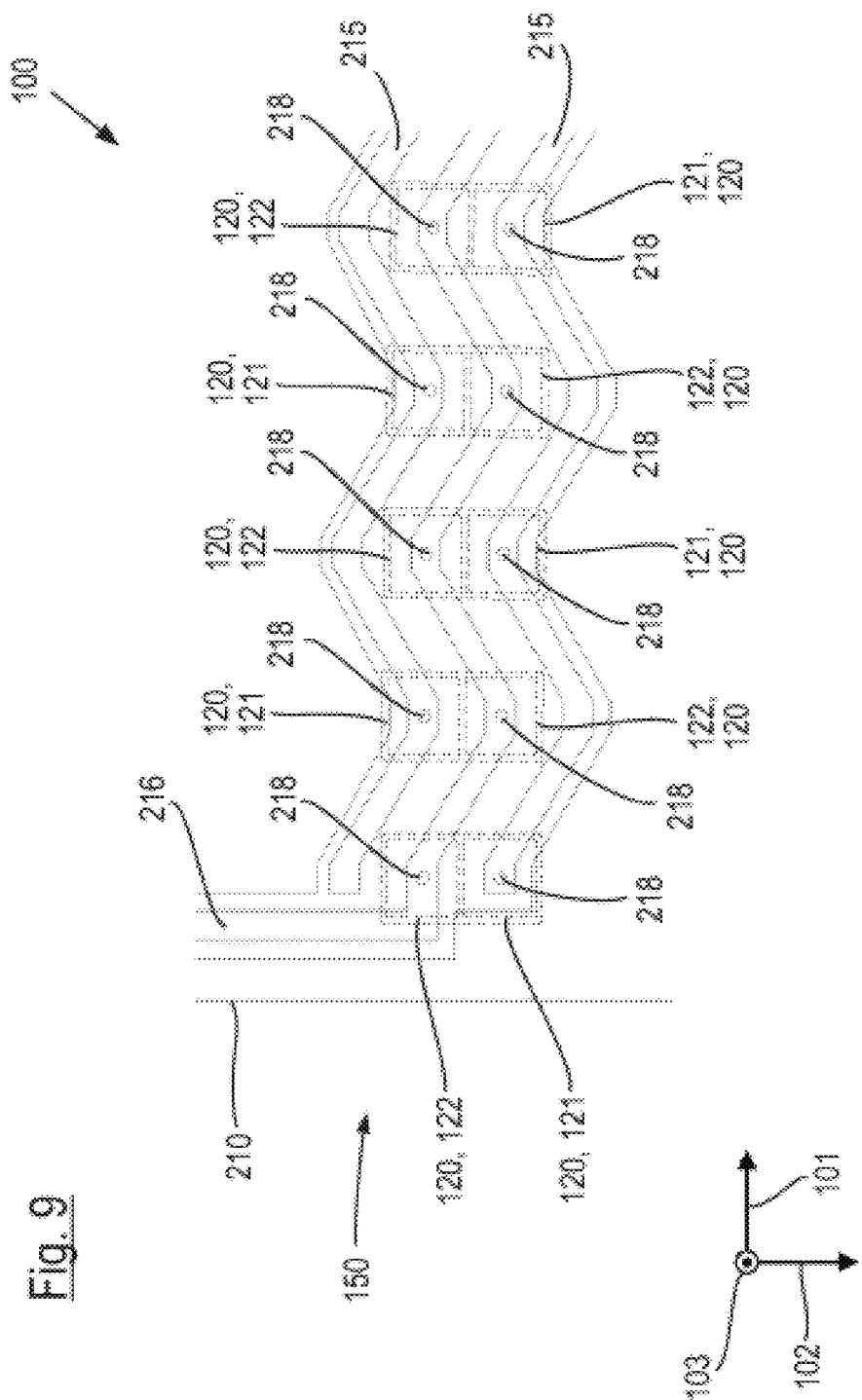
Figure 10:
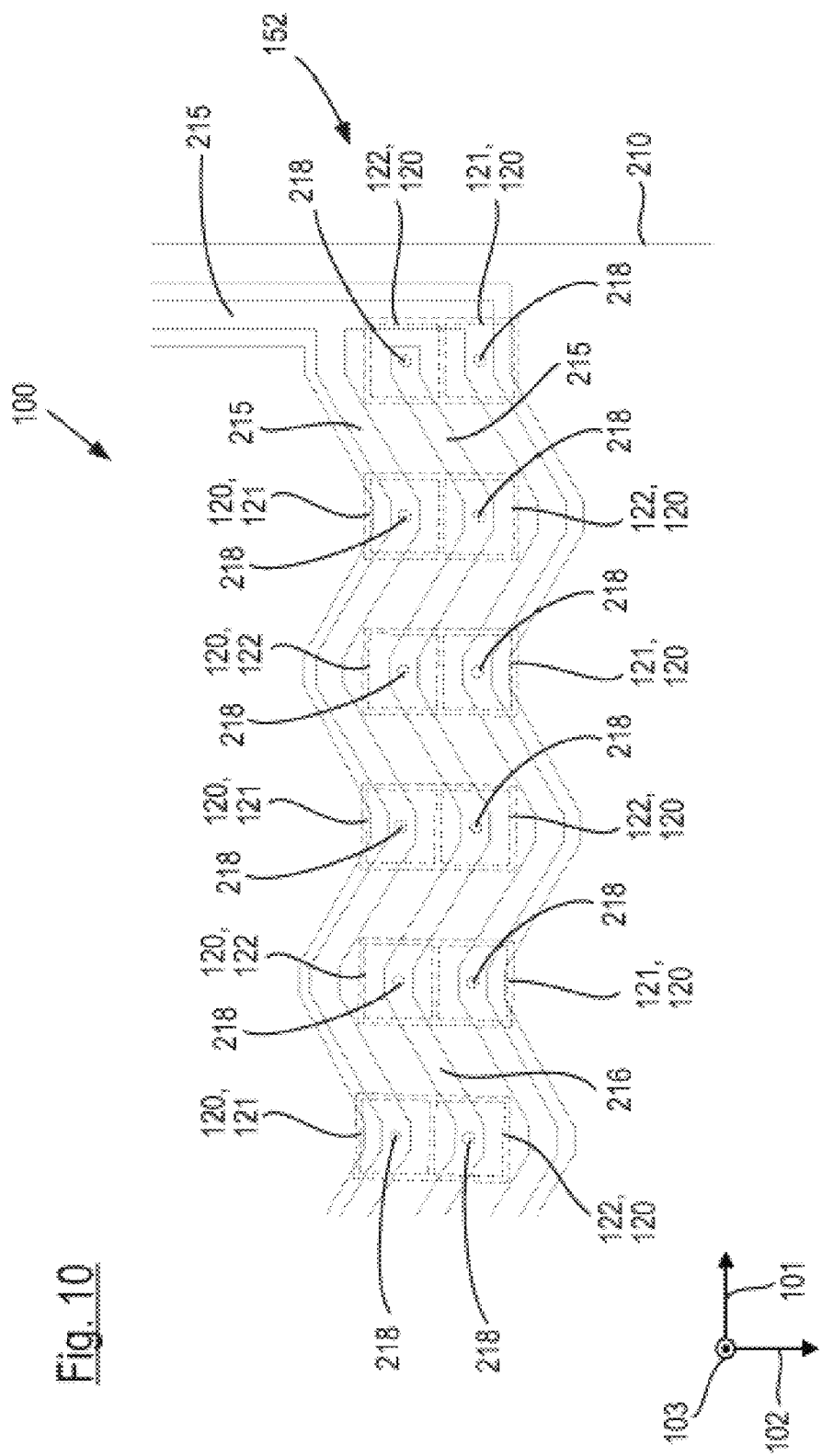
Figure 11:
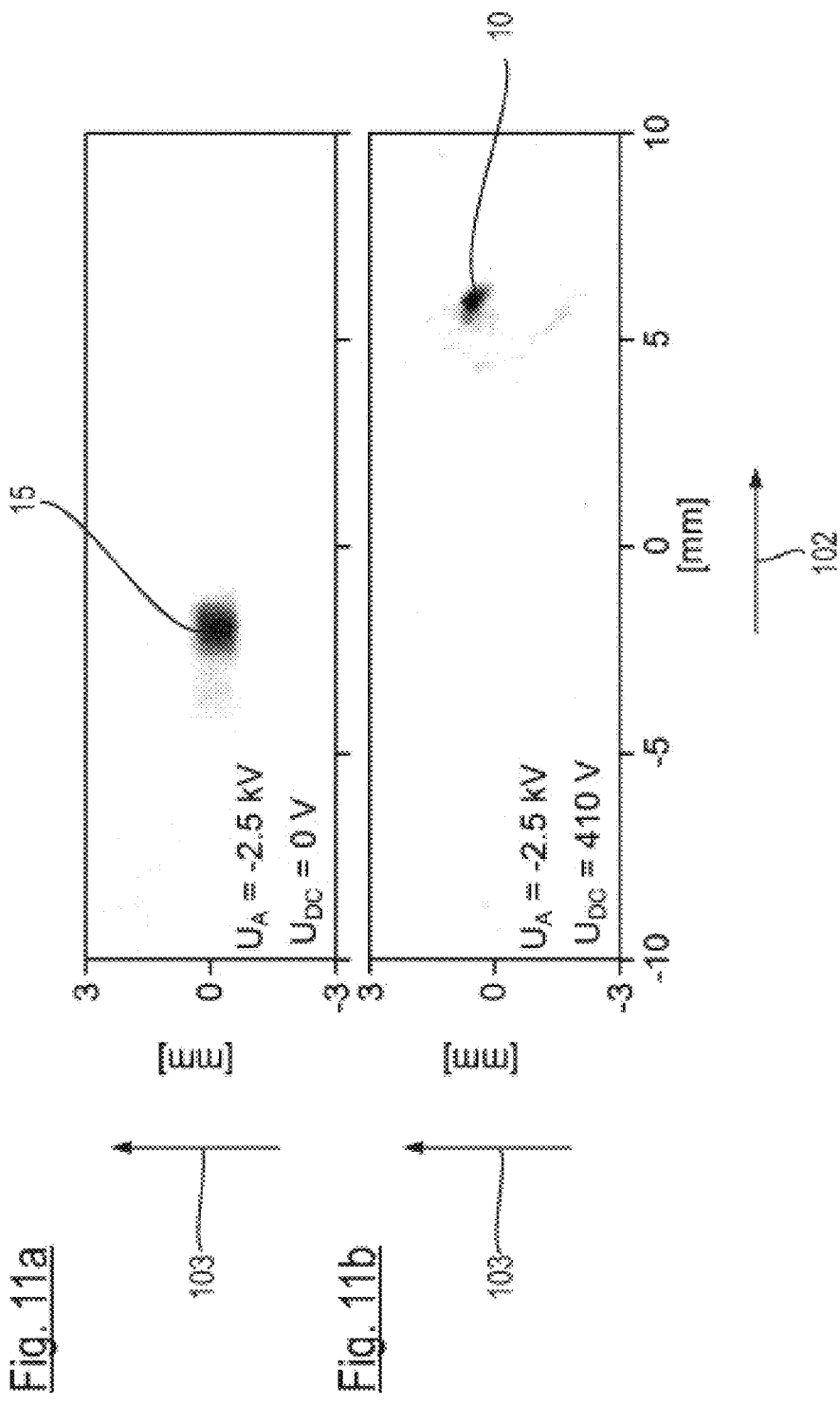
Figure 12:
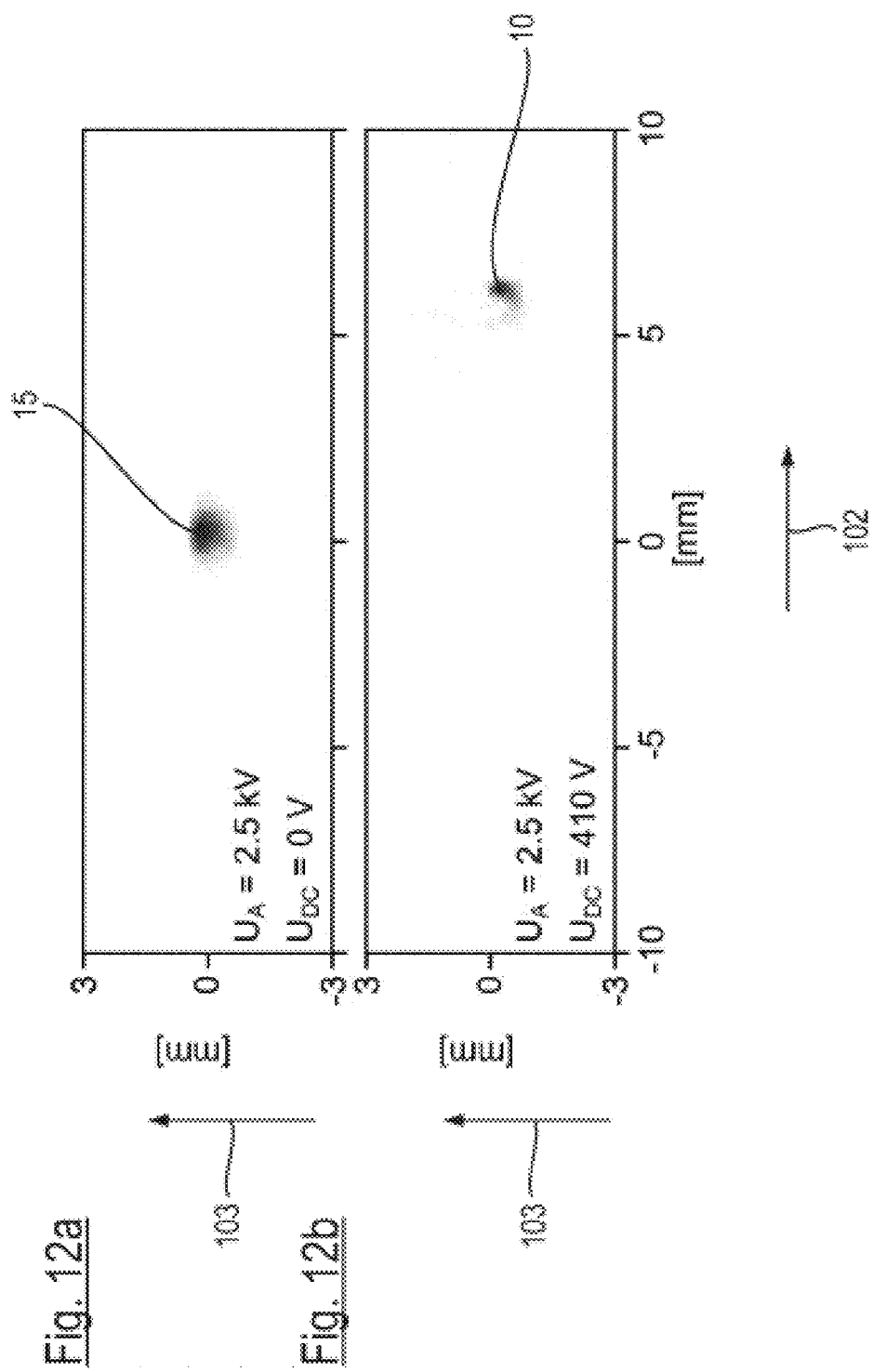
Figure 13:
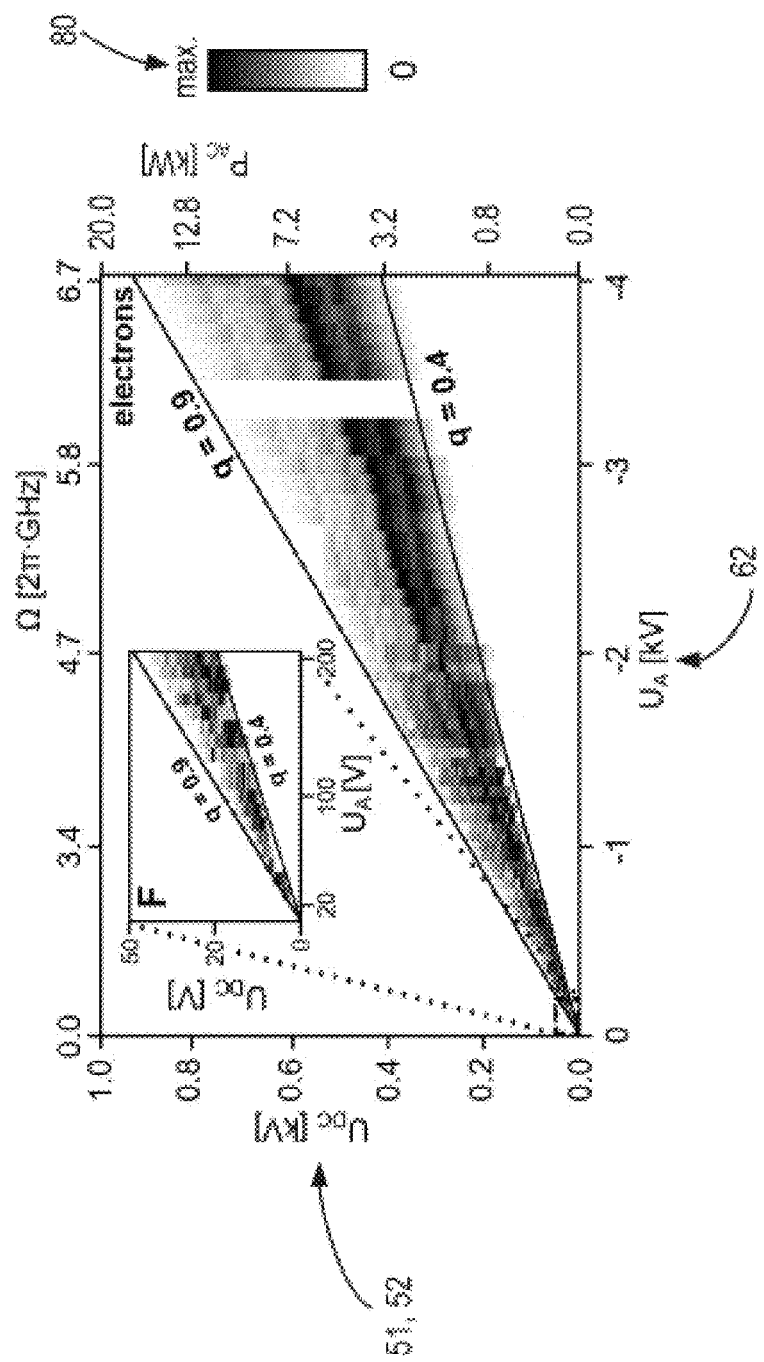
Figure 14:
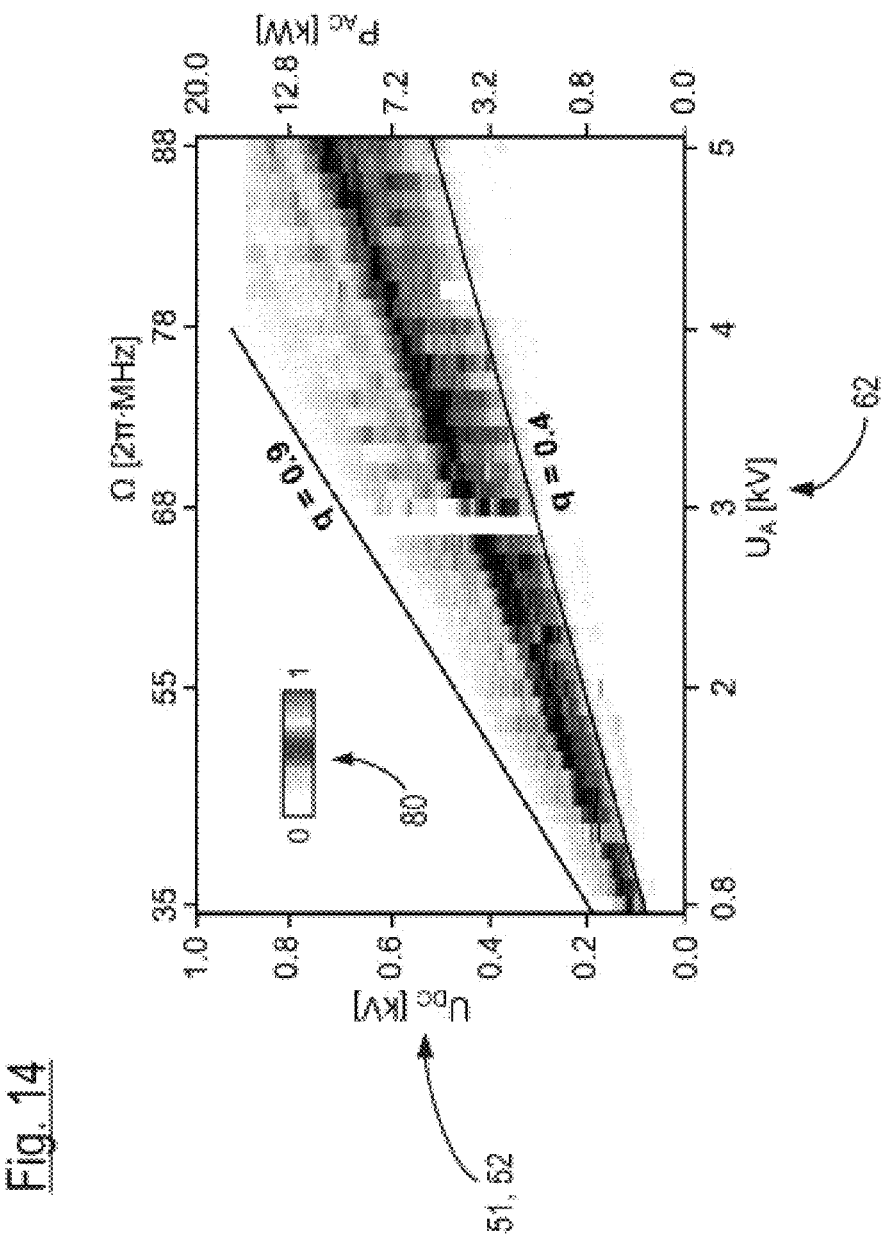
Figure 15:
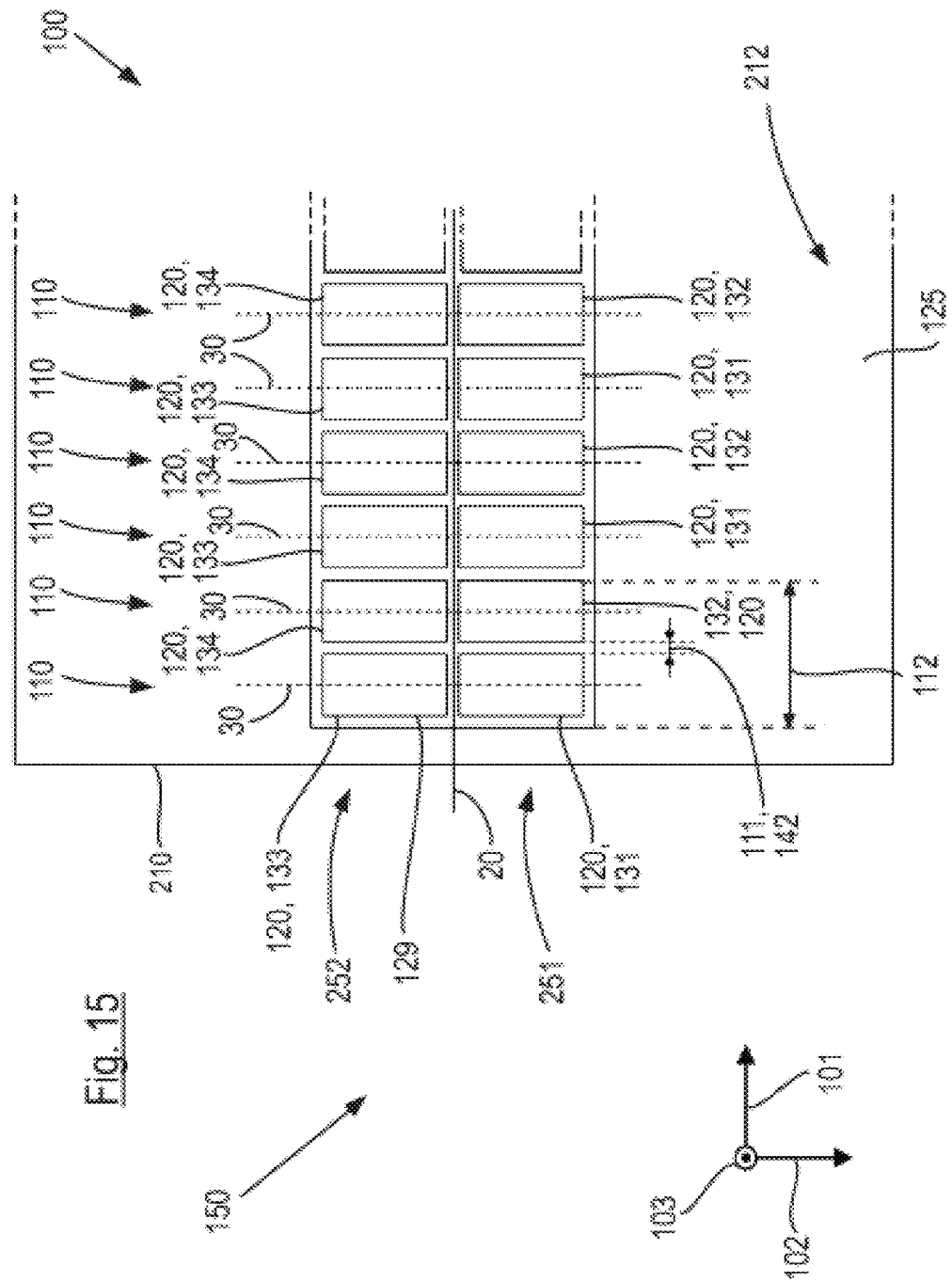
Figure 17:
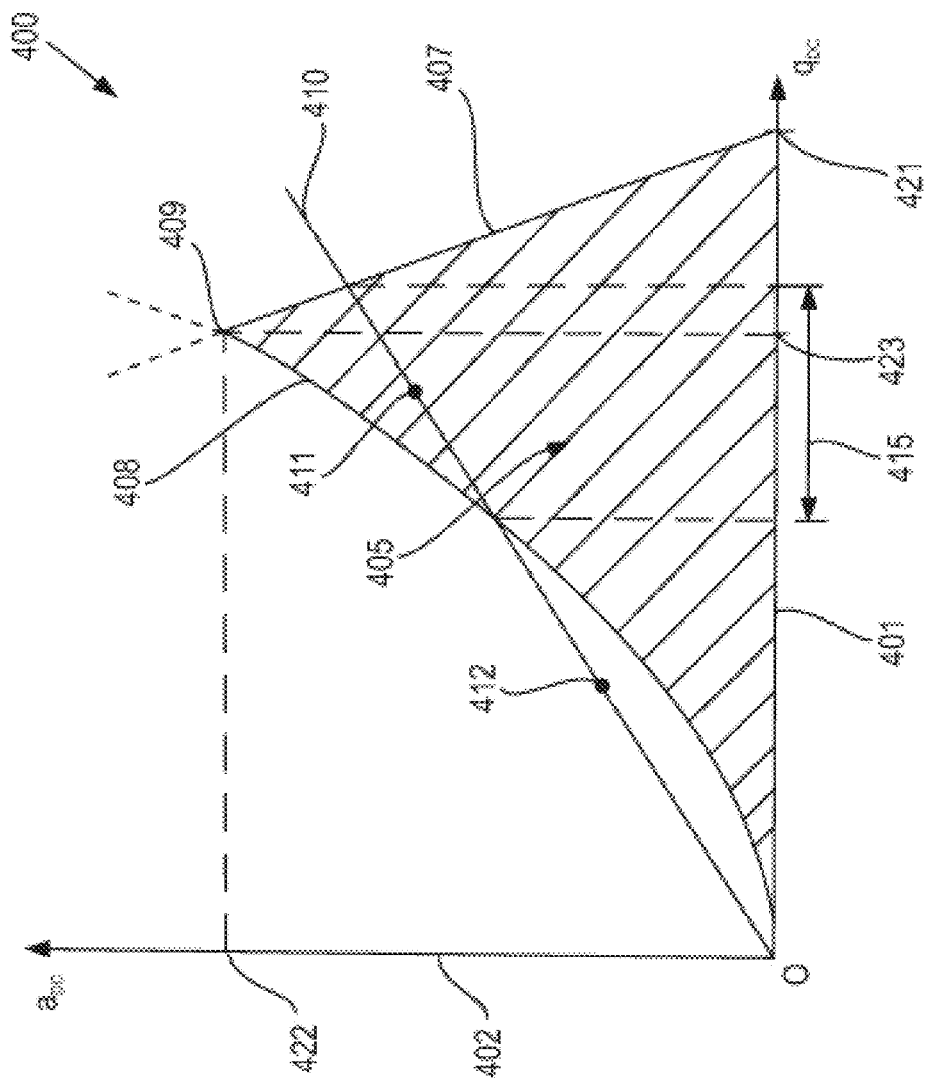
Figure 24:
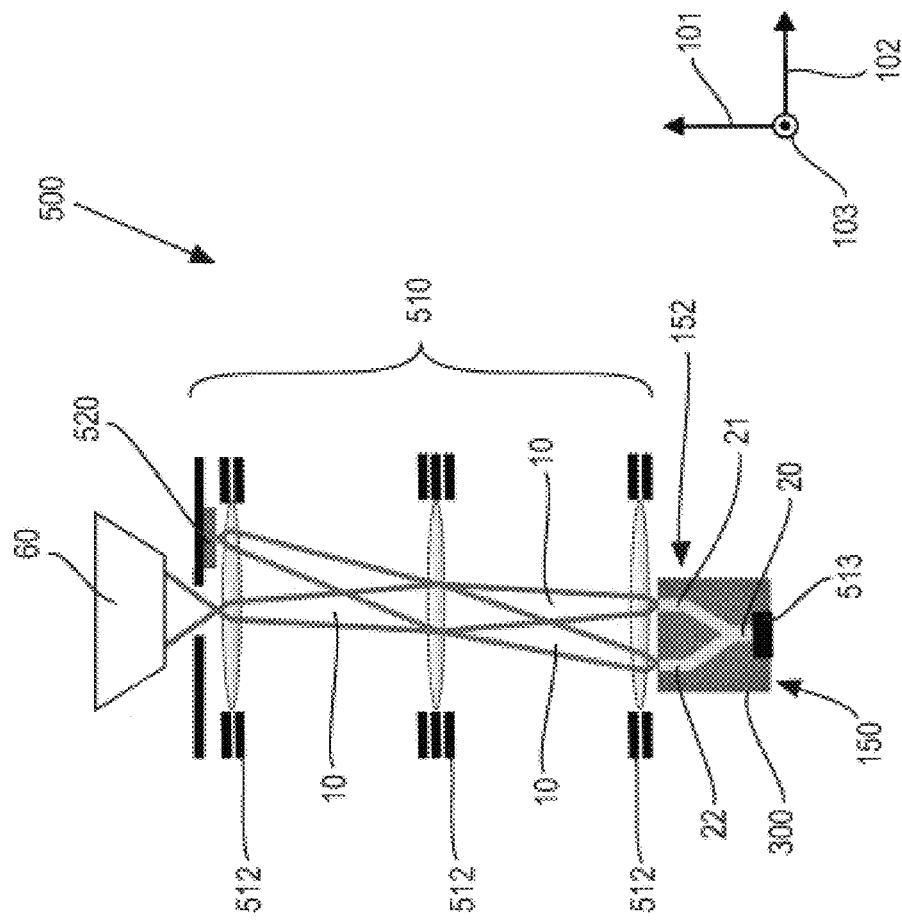

The invention will be explained in the following with reference to Figures. There are shown in a schematic representation in each case:

FIG. 1 a linear quadrupole trap in accordance with the prior art;

FIG. 2 a system for guiding a beam of charged particles with an electrode structure;

FIG. 3 a perspective representation of a first embodiment of the electrode structure;

FIG. 4 a plan view of a first conductor layer of the electrode structure;

FIG. 5 a section through the electrode structure in one of the transverse planes;

FIG. 6 a ponderomotive potential generated by the electrode structure;

FIG. 7 a plan view of a conductor layer of an electrode structure in accordance with a second embodiment;

FIG. 8 a plan view of a further conductor layer of the electrode structure in accordance with the second embodiment;

FIG. 9 a detailed view of supply lines at an input side of the electrode structure in accordance with the second embodiment;

FIG. 10 a detailed view of supply lines at an output side of the electrode structure in accordance with the second embodiment;

FIG. 11 experimental detector signals for detecting electrons at the output side of the electrode structure in accordance with the second embodiment;

FIG. 12 experimental detector signals for detecting helium ions at the output side of the electrode structure in accordance with the second embodiment;

FIG. 13 an intensity of the detector signal of a guided beam of electrons in dependence on an acceleration voltage and an electrode voltage;

FIG. 14 an intensity of the detector signal of a guided beam of helium ions in dependence on the acceleration voltage and the electrode voltage;

FIG. 15 a plan view of a conductor layer of a third embodiment of the electrode structure;

FIG. 16 a contacting of DC voltage electrodes of the electrode structure in accordance with the third embodiment;

FIG. 17 a stability diagram of the electrode structure in accordance with the third embodiment;

FIG. 18 a plan view of a first conductor layer of a fourth embodiment of the electrode structure formed as a junction;

FIG. 19 a transverse section through an electrode arrangement of the junction;

FIG. 20 transverse sections through ponderomotive potentials of the junction;

FIG. 21 detector signals for detecting electrons at the output side of the junction;

FIG. 22 a contacting of DC voltage electrodes of a first conductor layer of an alternative embodiment of the junction;

FIG. 23 a plan view of a first conductor layer of a further alternative embodiment of the junction; and FIG. 24 a use of the junction in an electron microscope.

DETAILED DESCRIPTION

Example embodiments will now be described more fully with reference to the accompanying drawings.

FIG. 2 shows a system 1 for guiding a beam 10 of charged particles along a longitudinal path 20. The system 1 comprises an acceleration apparatus 60 for accelerating the charged particles with a predefined acceleration voltage 62, and an electrode structure 100 having a planar conductor layer 212 arranged along the path 20. After the charged particles have been accelerated in the acceleration apparatus 60 with the acceleration voltage 62, they enter into a ponderomotive potential, which is generated by the conductor layer 212 along the path 20, at an input side 150 of the electrode structure 100, said ponderomotive potential transversely confining the charged particles along the path 20 in directions oriented perpendicular to the path 20. After the charged particles have passed through the transversely confining ponderomotive potential along the path 20, they exit the potential at an output side 152 of the electrode structure 100. The electrode structure 100 shown in FIG. 2 is configured by way of example to transversely deflect the beam 10 along a curve by means of the ponderomotive potential.

The system 1 furthermore comprises a DC voltage source 75 that is connected to the electrode structure 100 and that provides all the electrode voltages 51, 52 necessary for generating the ponderomotive potential to DC voltage electrodes, not shown in FIG. 2, of the electrode structure 100.

The system 1 further comprises an acceleration voltage source 73 that is connected to the acceleration apparatus 60 and that provides the acceleration voltage 62.

The DC voltage source 75 and the acceleration voltage source 73 are connected to a control apparatus 70 that predefines the acceleration voltage 62 and the electrode voltages 51, 52 applied to the DC voltage electrodes of the electrode apparatus 100 and matches them to one another such that the charged particles along the path 20 execute stable trajectories within the ponderomotive potential.

FIG. 3 sectionally shows a perspective representation of a first embodiment of the electrode structure 100 in which the path 20, along which the charged particles 11 are guided at a longitudinal speed 16, extends in a straight manner in a longitudinal direction 101. The electrode structure 100 comprises a planar first conductor layer 212 and a planar second conductor layer 222 arranged disposed opposite the first conductor layer 212 in a vertical direction 103 oriented perpendicular to the longitudinal direction 101. The conductor layers 212, 222 are aligned in parallel with one another and have a spacing 201 of 1 mm from one another in the vertical direction 103. The conductor layers 212, 222 extend along the longitudinal direction 101 and along a transverse direction 102 oriented perpendicular to the longitudinal direction 101 and to the vertical direction 103.

In alternative embodiments of the electrode structure 100, the spacing can generally also be less than 10 mm, less than 5 mm, less than 1 mm, less than 0.5 mm, less than 0.1 mm, less than 0.05 mm, or less than 0.01 mm.

The first conductor layer 212 comprises a first row 251 of DC voltage electrodes 120 extending along the longitudinal direction 101 and a second row 252 of DC voltage electrodes 120 extending in parallel next to the first row 251 in the transverse direction 102. In the individual rows 251, 252, DC voltage electrodes 120 alternately configured as first DC voltage electrodes 121 and as second DC voltage electrodes 222 are arranged in the longitudinal direction 101. In the transverse direction 102, the first and second DC voltage electrodes 121, 122 are arranged in pairs next to one another in each case. The first and second DC voltage electrodes 121, 122 each have opposite polarities with respect to ground, wherein the first DC voltage electrodes 121 are supplied with a first DC voltage 51 provided by the DC voltage source 75 and the second DC voltage electrodes 122 are supplied with a second DC voltage 52 provided by the DC voltage source 75. The DC voltages 51, 52 are oppositely polarized with respect to ground and have the same voltage magnitude $U_{DC}$ with respect to ground so that the first DC voltage 51 amounts to $+U_{DC}$ and the second DC voltage 52 amounts to $-U_{DC}$.

In the second conductor layer 222, the DC voltage electrodes 120 are likewise arranged in a first row 251 and a second row 252 along the longitudinal direction 101, wherein the first and second rows 251, 252 of the first and second conductor layers 212, 222 are in each case disposed opposite one another in the vertical direction 103. In the rows 251, 252 of the second conductor layer 222, DC voltage electrodes 120 alternately configured as first counter-electrodes 123 and as second counter-electrodes 124 are arranged in the longitudinal direction 101. In this respect, in the vertical direction 103, the first counter-electrodes 123 are disposed opposite the first DC voltage electrodes 121 of the first conductor layer 212 and the second counter-electrodes 124 are disposed opposite the second DC voltage electrodes 122 of the first conductor layer 212. The first counter-electrodes 123 are supplied with the second DC voltage 52 and the second counter-electrodes 124 are supplied with the first DC voltage 51.

FIG. 4 shows a plan view of the first conductor layer 212. The DC voltage electrodes 120 are arranged at a spacing 111 of 1.4 mm from one another in the two rows 251, 252 and have an electrode length 141 of 1.3 mm in the longitudinal direction 101. The DC voltage electrodes 120 are formed in a ground plane 125 of the first conductor layer 212 and are electrically insulated from the ground plane 125 by insulating gaps 129. A period length 112 with which the DC voltages of the DC voltage electrodes vary along the longitudinal direction 101 amounts to $L_p$=2.4 mm, wherein two DC voltage electrodes 120 are arranged behind one another within the period length 112 in the longitudinal direction 101. Overall, the electrode structure 100 has a length 105 of, for example, 100 mm in the longitudinal direction 101.

DC voltage electrodes 121, 122 arranged next to one another in the transverse direction 102, together with the counter-electrodes 123, 124 disposed opposite them in the vertical direction 103, in each case form electrode arrangements 110 that generate static quadrupole fields centered around the path 20 in transverse planes 30 extending centrally through the electrode arrangements 110 and oriented perpendicular to the longitudinal direction 101. Between the individual electrode arrangements 110, the ground plane 125 in each case forms ground electrodes that separate the DC voltage electrodes 120 of the individual electrode arrangements 110 from one another along the longitudinal direction 101.

FIG. 5 shows a section through the electrode structure 100 in one of the transverse planes 110. In the transverse direction 102, the DC voltage electrodes 120 each have an electrode width 140 of 1.4 mm. The insulating gap 129 that surrounds the DC voltage electrodes 120 has a gap width 142 of 0.1 mm. The longitudinal path 20 along which the charged particles 11 are guided in a transversely confined manner lies in a central plane 108 between the first and second conductor layer 212, 222 and in each case has a path spacing 106 of $R_0$=0.5 mm from the conductor layers 212, 222. As shown in FIGS. 3 to 5, the first and second conductor layers 212, 222 are formed with mirror symmetry with respect to the central plane 108.

The first conductor layer 212 is arranged on a first surface 211 of a first carrier structure 21 and the second conductor layer 222 is arranged on a second surface 221 of a second carrier structure 220. At sides that are disposed opposite the surfaces 211, 221, the carrier structures 210, 220 each have further conductor layers 214, 224 in each of which a first supply line 215 and a second supply line 216 are formed. The supply lines 215, 216 each extend along the longitudinal path 20 in the conductor layers 214, 224.

The first supply line 215 is supplied with the first electrode voltage 51 and the second supply line 216 is supplied with the second electrode voltage 52. The first DC voltage electrodes 121 and the second counter-electrodes 124 are connected via vias 218, which each extend through the carrier structures 210, 220, to the respective first supply lines 215 of the conductor layers 214, 224 and the second DC voltage electrodes 122 and the second counter-electrodes 124 are connected via analogous vias 218 to the respective second supply line 216 of the conductor layers 214, 224.

The individual electrode arrangements 110 each form quadrupole lenses that are centered around the path 20 and that have a longitudinally alternating polarity. In the rest frame of the charged particles 11 propagating along the path 20, the electrode arrangements 110 generate an oscillating quadrupole field with an effective frequency $$\Omega = 2\pi \frac{v_l}{L_p} = \frac{2\pi\sqrt{2 \cdot QU_A/M}}{L_p}.$$

On average over time, the charged particles 11 experience a transverse return force towards the path 20 that is described by the ponderomotive potential.

In FIG. 6, the ponderomotive potential $$\Psi = \frac{Q^2 \langle E^2 \rangle}{4 M \Omega^2}$$

is shown which the electrode structure 100 shown in the images 4 and 5 generates in the transverse planes 30 for electrons having a kinetic energy of 1 keV ($_{UA}$=1 kV) and electrode voltages 51, 52 of $U_{DC}$=+100 V. The mean value $\langle E^2 \rangle$ of the square of the absolute value of the electric field was in this respect formed over a period length 112, wherein the square of the absolute value of the field was formed from all three spatial field components $E_x$, $E_y$, $E_z$ along the direction 101, 102, 103. In a first approximation, the ponderomotive potential $\Psi$ forms a harmonic potential that generates a linear return force towards the path 20 in all the directions 102, 103 perpendicular to the longitudinal path 20.

FIG. 7 shows a second embodiment of the electrode structure 100 in which the charged particles 11 are guided along an s-shaped path 20. In this respect, a plan view of the first conductor layer 212 of the electrode structure 100 is shown in FIG. 7. Unless differences are apparent from the Figures and the description, the second embodiment of the electrode structure 100 shown in FIG. 7 is formed as disclosed in connection with the first embodiment shown in FIGS. 3 to 5, and vice versa.

At a longitudinal side, the electrode structure 100 has a first contact surface 217, which is electrically conductively connected via a via 218 to the first supply line 215 at the further conductor layer 214 disposed opposite the first conductor layer 212, and a contact surface 219 that is electrically conductively connected via a further via 218 to the second supply line 215 at the further conductor layer 214.

FIG. 8 shows a plan view of the further conductor layer 214 of the second embodiment of the electrode structure 100. In this respect, the viewing direction is oriented opposite the vertical direction 103 so that a side of the further conductor layer 214 facing the first carrier structure 210 can be seen. The supply lines 215, 216 extend next to one another along the longitudinal path 20, with the first supply line 215 branching into two partial lines arranged at both sides of the second supply line 216. In this respect, the partial lines of the first supply line 215 and the second supply line 216 in each case extend in a meandering manner next to one another along the path 20.

FIG. 9 shows a detailed view of the supply lines 215, 216 at the input side 150 of the electrode structure 100 and FIG. 10 shows a detailed view of the supply lines 215, 216 at the output side 152 of the electrode structure 100. In addition, the DC voltage electrodes 120 formed in the first conductor layer 212 are shown as dashed lines in FIGS. 9 and 10 in each case. The second DC voltage electrodes 122 are electrically conductively connected in order via the vias 218 to the second supply line 216 extending between the two partial lines of the first supply line 215. The partial lines of the first supply line 215 are electrically conductively connected to the first DC voltage electrodes 121 of the individual electrode arrangements 110, in an alternating manner in each case, via vias 218 along the longitudinal direction 101. The contacting of the DC voltage electrodes 121, 122 shown in FIGS. 8 to 10 can also take place analogously in the first embodiment of the electrode structure 100.

FIGS. 11a and 11b show experimental detector signals for detecting electrons that have a kinetic energy of 2.5 keV and that exit the ponderomotive potential of the s-shaped electrode structure 100 in accordance with the second embodiment at the output side 152. The DC voltage electrodes 120 were connected to ground potential ($U_{DC}$=0 V) during recording of the detector signal shown in FIG. 11a, whereas the DC voltage electrodes 120 were supplied with electrode voltages of $U_{DC}$=410 V during the recording of the detector signal shown in FIG. 11b. If the DC voltage electrodes 120 are at ground potential, the electrons exit the electrode structure 100 as an unguided beam 15. In contrast, at electrode voltages of $U_{DC}$=410 V, all the electrons are guided as a transversely confined beam 10 along the path 20 so that they exit the electrode structure 100 in the transverse direction 102 laterally offset from the position of the unguided beam 10.

FIGS. 12a and 12b show analogous detector signals for helium ions for the same acceleration voltage 62 of 2.5 kV. As can be seen from FIGS. 11a/b and 12a/b, the transverse confinement of the charged particles in the transverse ponderomotive potential generated by the electrode structure 100 is independent of the mass of the charged particles 11 at the same acceleration voltage 62.

FIG. 13 shows the intensity 80 of the detector signal of the guided beam 10 of electrons in dependence on the acceleration voltage 62 and the electrode voltages 51, 52 and FIG. 14 shows the corresponding intensity 80 of the detector signal of the guided beam 10 of helium ions. As can be seen from FIGS. 13 and 14, both types of charged particles 11 are stably guided along the longitudinal path when the stability parameter $q_{DC}$ given by the ratio of the electrode voltage $U_{DC}$ and the acceleration voltage $U_A$ lies between 0.4 and 0.9. The effective frequencies $$\Omega = \frac{2\pi\sqrt{2 \cdot QU_A/M}}{L_p},$$

which result for the respective particles from the acceleration voltage $U_A$ determining the kinetic energy of the particles, are furthermore specified in FIGS. 13 and 14. Further experimental investigations have shown that the mentioned limits of the stability parameter $q_{DC}$ are also valid for ions of a larger mass, for instance for neon ions, argon ions, krypton ions, or xenon ions.

As can be seen from FIG. 13, effective frequencies of more than 5 GHz, in particular of more than 6.5 GHz, can be generated for electrons. Alternative embodiments of the electrode structure 100 with smaller period lengths 112 can also be configured to produce effective frequencies for electrons of more than 10 GHz, for example, of more than 50 GHz, 100 GHz, 500 GHz, or 1 THz. For example, with a period length 112 of 56 µm, an effective frequency of 330 GHz can be generated for electrons having a kinetic energy of 1 keV.

FIG. 15 shows a plan view of the first conductor layer 212 of a third embodiment of the electrode structure 100. Unless differences are apparent from the Figures and the description, the third embodiment of the electrode structure 100 is formed as is disclosed for the first embodiment, and vice versa. In the third embodiment of the electrode structure 100, the DC voltage electrodes 120, unlike in the first embodiment, are arranged directly adjoining one another along the longitudinal path 20. The third embodiment of the electrode structure 100 in particular does not have any sections of the ground plane 125 arranged in the longitudinal direction 101 between the individual electrode arrangements 110. Instead, the individual DC voltage electrodes 120 are spaced apart at a longitudinal spacing 111 in the longitudinal direction 101 that corresponds to the gap width 142 between the DC voltage electrodes 120 and the ground plane 125. In general, all other described embodiments of the electrode structure 100 can also have DC voltage electrodes 120 that are arranged directly adjoining another as shown in FIG. 15.

The third embodiment of the electrode structure 100 shown in FIG. 15 is furthermore configured to generate multipole fields formed as quadrupole fields in the transverse planes 30, said multipole fields alternating along the path 20 by a multipole field that is different from zero and that is likewise formed as a quadrupole field. This is achieved in that electrode arrangements 110 disposed next to one another along the longitudinal direction 101 each generate multipole fields having opposite polarities and different field magnitudes.

For this purpose, first DC voltage electrodes 131 having a first electrode voltage $U_0+U_{DC}$ and second DC voltage electrodes 132 having a second electrode voltage $U_0-U_{DC}$ are alternately arranged in the first row 251, wherein the first and second electrode voltages have a first mean value $U_0$. Third DC voltage electrodes 133 having a third electrode voltage $-U_0-U_{DC}$ and fourth DC voltage electrodes 134 having a fourth electrode voltage $-U_0+U_{DC}$ are alternately arranged in the second row 252, wherein the third and fourth electrode voltages have a second mean value $-U_0$. In this respect, the first and second mean values are symmetrically disposed about the ground potential of 0 V. Alternatively, the first and second mean values can also be symmetrically disposed about a potential different from zero, which brings about an electrical potential different from zero at the location of the path 20.

DC voltage electrodes 120 arranged next to one another in the transverse direction 102 are each configured either as first DC voltage electrodes 131 having the first electrode voltage $U_0+U_{DC}$ and as third DC voltage electrodes 133 having the third electrode voltage $-U_0-U_{DC}$ or as second DC voltage electrodes having the second electrode voltage $U_0-U_{DC}$ and fourth DC voltage electrodes 134 having the fourth electrode voltage $-U_0+U_{DC}$. As in the first and second embodiments of the electrode structure 100, the third embodiment of the electrode structure 100 also comprises counter-electrodes that are disposed opposite the DC voltage electrodes 120 in the vertical direction 103 in each case, wherein both electrodes disposed opposite one another in the vertical direction 103 and electrodes arranged next to one another in the transverse direction 102 have different electrode voltages in each case.

Thus, the counter-electrodes disposed opposite the first DC voltage electrodes 131 in the vertical direction 103 are supplied with the third electrode voltage $-U_0-U_{DC}$ and the counter-electrodes disposed opposite the third DC voltage electrodes 133 in the vertical direction 103 are supplied with the first electrode voltage $U_0+U_{DC}$. Analogously, the counter-electrodes disposed opposite the second DC voltage electrodes 132 in the vertical direction 103 are supplied with the fourth electrode voltage $-U_0+U_{DC}$ and the counter-electrodes disposed opposite the fourth DC voltage electrodes 134 in the vertical direction 103 are supplied with the second electrode voltage $U_0-U_{DC}$.

FIG. 16 shows a schematic representation of the contacting of the DC voltage electrodes 120 arranged in the first conductor layer 212 by a first supply line 135 guiding the first electrode voltage $U_0+U_{DC}$, a second supply line 136 guiding the second electrode voltage $U_0-U_{DC}$, a third supply line 137 guiding the third electrode voltage $-U_0-U_{DC}$, and a fourth supply line 138 guiding the fourth electrode voltage $-U_0+U_{DC}$. The supply lines 135, 136, 137, 138 each extend in parallel with one another in the further conductor layer 214 at the side of the carrier structure 210 disposed opposite the first conductor layer 212 and are electrically conductively connected to the DC voltage electrodes 120 of the first conductor layer 212 by means of individual vias 218.

Due to the first and second mean values $\pm U_0$ of the electrode voltages, a quadrupole field centered around the path 20 and homogeneous along the path 20 is generated that generates a stability parameter $$a_{DC} = \frac{\eta \cdot L_P^2 \cdot U_0}{\pi^2 \cdot R^2 \cdot U_A}$$

different from zero as a superposition field. Only charged particles 11 whose kinetic energies lie in an energy range bounded at both sides are thereby stably guided along the longitudinal path 20.

This is illustrated by FIG. 17, which shows a stability diagram 400 of the electrode structure in accordance with the third embodiment, wherein the stability diagram corresponds to the stability diagram of a linear quadrupole trap. A stability range 405 comprises all the value pairs of a first stability parameter 401 ($q_{DC}$) and a second stability parameter 402 ($a_{DC}$) for which the charged particles 11 propagate on stable trajectories along the path 20. The stability range 405 is bounded by a first stability limit 407 for large values of the first stability parameter 401 and is bounded by a parabolic second stability limit 408, which extends through the origin, for small values of the first stability parameter 401. The stability limits 407, 408 intersect at a vertex 409 that defines a maximum value 422 of the second stability parameter 402 of $a_{DC,max}=0.237$ and an associated value 423 of the first stability parameter 401 of $q_{DC}=0.706$.

With a predefined ratio $U_0/U_{DC}$, the operating parameters for all the acceleration voltages $U_A$ lie on a working line 410 that is a line through the origin with a gradient $2U_0/U_{DC}$. Individual acceleration voltages $U_A$ or particle energies then define operating points 411, 412 on the working line 410, wherein the operating points 411, 412 move away from the origin as the acceleration voltage $U_A$ or particle energy decreases. Thus, a first operating point 411 shown in FIG. 17 corresponds to a first acceleration voltage and the second operating point 412 that is likewise shown corresponds to a higher second acceleration voltage.

A pass band 415, which is defined by the intersection of the stability range 405 with the working line 410, then determines the particle energies at which the charged particles 11 execute stable trajectories in the ponderomotive potential of the electrode structure 100. The greater the ratio $U_0/U_{DC}$ is selected, the narrower the pass band 415 is. Without the static superposition field, $a_{DC}=0$ and the electrode structure 100 acts as a high-pass filter, wherein a maximum value 421 of the first stability parameter 401 is defined by $q_{DC,max}=0.92$.

FIG. 18 shows a representation, not to scale, of a first conductor layer 212 of a fourth embodiment of the electrode structure 100. Unless differences are apparent from the Figures and the description, the fourth embodiment of the electrode structure 100 shown in FIG. 18 is formed as disclosed in connection with the first embodiment shown in FIGS. 3 to 5, and vice versa.

The fourth embodiment of the electrode structure 100 is formed as a junction 300 to guide the charged particles along a path 20 that splits into a first partial path 21 and a second partial path 22. The individual electrode arrangements 110 each comprise three DC voltage electrodes 120, which are arranged next to one another in the transverse direction 102, in the first conductor layer 212, wherein the DC voltage electrodes 120 are arranged along the longitudinal direction 101 in an inner electrode row 320 and in two outer electrode rows 330, 340 extending at both sides of the inner electrode row 320 in the transverse direction 102. The individual DC voltage electrodes 120 have a length of 550 µm and a spacing of 750 µm from one another in the longitudinal direction 101. The electrode structure 100 has a length 105 of 113 mm along the longitudinal direction 101.

The junction 300 forms a beam splitter that simultaneously splits the charged particles 11 into a first portion propagating along the first partial path 21 and a second portion propagating along the second partial path 22. A first electrode voltage $+U_{DC}$ and an oppositely polarized second electrode voltage $-U_{DC}$ are in each case alternately applied to the DC voltage electrodes 120 of the individual electrode rows 320, 330, 340 in the longitudinal direction 101. Furthermore, the first and second electrode voltages $+U_{DC}$, $-U_{DC}$ are likewise alternately applied to the DC voltage electrodes 120 of the individual electrode arrangements 110 arranged next to one another in the transverse direction 102 so that DC voltage electrodes 120 adjacent to one another in the transverse direction 102 each have different electrode voltages.

FIG. 19 shows a transverse section perpendicular to the longitudinal direction 101 through one of the electrode arrangements 110 of the junction 300. The junction 300 comprises a planar second conductor layer 222 that is arranged at a spacing 201 of 1 mm in parallel with the first conductor layer 212. The electrode structure of the second conductor layer 222 corresponds to the electrode structure of the first conductor layer 212 mirrored at the central plane 108.

In the first conductor layer 212, the DC voltage electrodes 120 of the first outer electrode row 330 each form first outer electrodes 331 and the DC voltage electrodes 120 of the second outer electrode row 340 each form second outer electrodes 341. Inner electrodes 321 of the inner electrode row 320 are in each case arranged between the outer electrodes 331, 341. First outer counter-electrodes 332 which are disposed opposite the first outer electrodes 331 of the first conductor layer 212; second outer counter-electrodes 342 which are disposed opposite the second outer electrodes 341 of the first conductor layer 212; and inner counter-electrodes 322, which are disposed opposite the inner electrodes 321 of the first conductor layer 212, are arranged in the second conductor layer 222.

In the junction 300, the DC voltage electrodes 321, 331, 341 of the first conductor layer 212 and the counter-electrodes 322, 332, 342 that are in each case disposed opposite the individual DC voltage electrodes 321, 331, 341 have different electrode voltages. If the two outer electrodes 331, 341 of the first conductor layer 212, for example, have the first electrode voltage $+U_{DC}$ and the inner electrode 321 has the second electrode voltage $-U_{DC}$, the two outer counter-electrodes 332, 342 are at the second electrode voltage $-U_{DC}$ and the inner counter-electrodes 322 are at the first electrode voltage $+U_{DC}$. In the case of electrode arrangements 110 arranged longitudinally adjacent to such an electrode arrangement 110, the two outer electrodes 331, 341 and the inner counter-electrodes 322 then have the second electrode voltage $-U_{DC}$ and the inner electrode 321 as well as the two outer counter-electrodes 332, 342 have the first electrode voltage $+U_{DC}$.

At the sides of the carrier structures 210, 220 facing away from the conductor layers 212, 222, the junction 300 in each case has two first supply lines 215 guiding the first electrode voltage $+U_{DC}$ and two second supply line 216 guiding the second electrode voltage $-U_{DC}$, wherein the first and second supply lines 215, 216 each extend along the longitudinal direction 101 and are arranged alternately next to one another in the transverse direction 102. Analogously to the supply lines 215, 216 of the electrode structure 100 in accordance with the second embodiment, the supply lines 215, 216 of the junction 300 extend in a meandering manner along the longitudinal direction 101. In this respect, the supply lines 215, 216 inwardly arranged at the first carrier structure 210 each alternately contact either one of the outer electrodes 331, 341 or the inner electrode 321, 322, while the two outwardly arranged supply lines 215, 216 are alternately connected to every second first or second outer electrode 331, 341 in the longitudinal direction 101. The contacting of the counter-electrodes 322, 332, 342 takes place analogously at the second carrier structure 220.

As shown in FIG. 18, the DC voltage electrodes 120 of the inner electrode row 320 widen continuously along the longitudinal direction 101. The inner electrodes 321, 322 have a transverse width 325 of 300 µm at the input side 150 and have a transverse width 325 of 2.2 mm at the output side 152. The outer electrodes 331, 332, 341, 342 each have a constant transverse width 335 of 1.4 mm along the longitudinal direction 101.

Figures 20A, 20B, 20C:
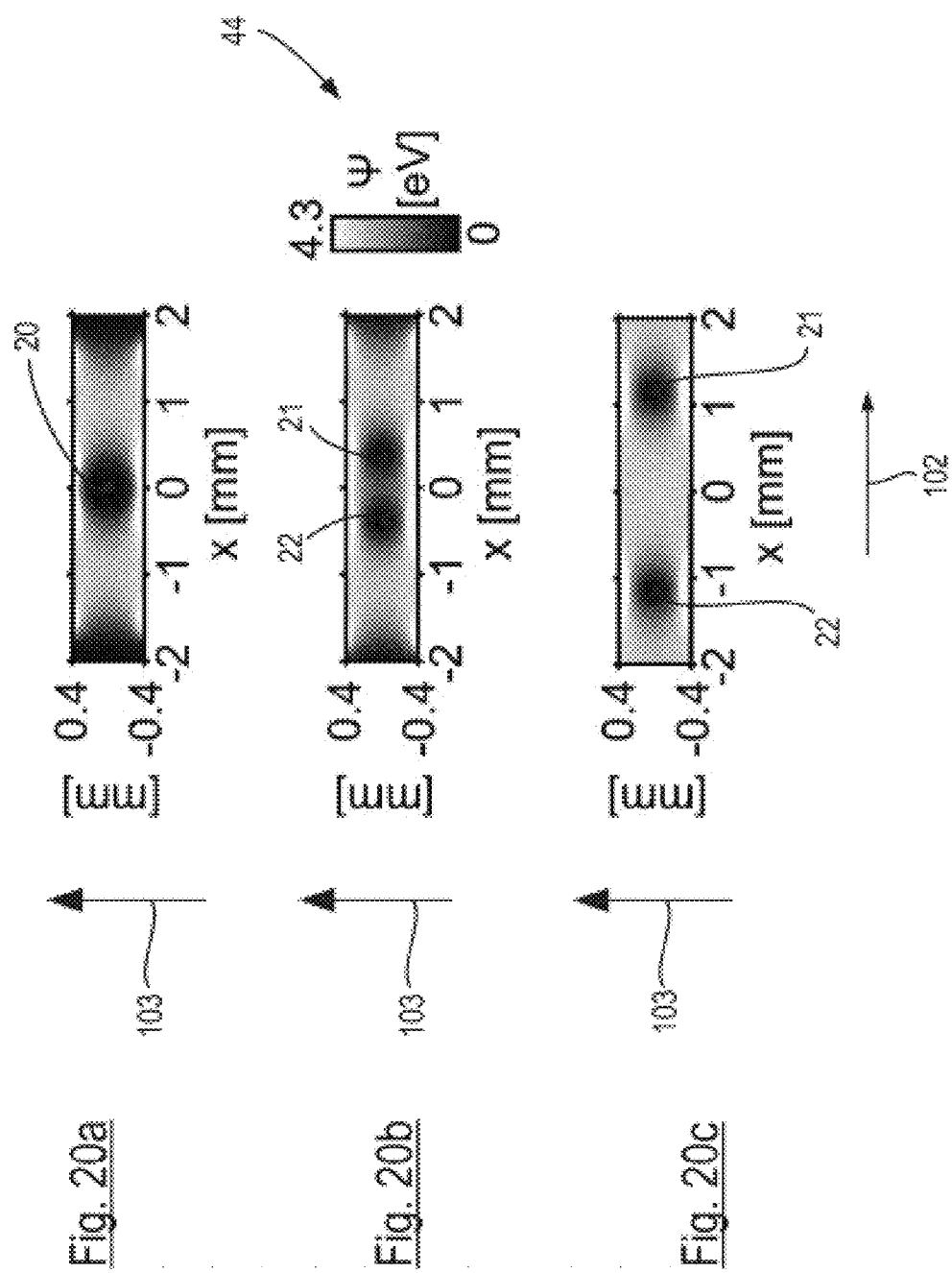

The junction 303 is configured to generate a multipole field having a dominant quadrupole component in transverse planes 310 disposed at the input side 150. The corresponding ponderomotive potential 44 is shown in a transverse section in FIG. 20a and has a single minimum at the location of the longitudinal path 20. At the center of the junction 300, the electrode arrangements 110 generate a multipole field having a dominant hexapole component due to the widening of the central electrodes 321, 32 in a transverse plane 311. The associated ponderomotive potential 44 is shown in FIG. 20b and has two minima, which are spaced apart along the transverse direction 102, at the location of the two partial paths 21, 22. At the output side 152, the junction 300 generates a multipole field in a transverse plane 312 whose dominant components are two quadrupole fields having two centers, which are spaced apart along the transverse direction 102, at the location of the partial paths 21, 22. The associated ponderomotive potential 44 is shown in FIG. 20c and has two minima at the location of the two partial paths 21, 22 that have a significantly larger transverse spacing from one another than the two minima of the potential shown in FIG. 20b.

Figures 21A, 21B:
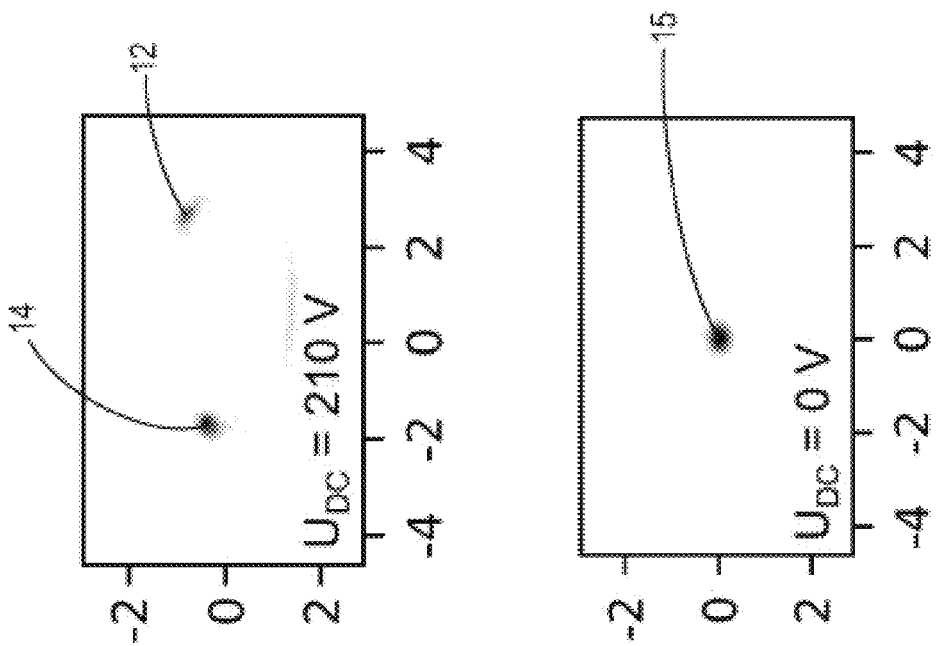

The ponderomotive potentials 44 shown in FIGS. 20a, 20b, 20c were each calculated for an electron beam having a longitudinal energy of 800 eV and for a voltage amplitude of $U_{DC}=210V$. FIG. 21a shows a corresponding detector signal having an electron beam split into a first portion 12 and a second portion 14. For comparison, FIG. 21a shows an experimental detector signal for grounded DC voltage electrodes 120 that only detects a single unguided beam 15 of electrons.

With the voltage assignment described above, the junction 300 simultaneously splits the incoming beam 10 of charged particles into the first and second portions 12, 14. In accordance with an alternative embodiment, the junction 300 can also be configured to selectively split the incoming beam 10 of charged particles either into the first portion 12 propagating along the first partial path 21 or into the second portion 14 propagating along the second partial path 22 so that the junction acts as a switch.

A selective splitting is, for example, possible when the junction 300 is configured to selectively apply the electrode voltage of the transversely adjacent first outer electrodes 331, 332 or the electrode voltage of the transversely adjacent second outer electrodes 341, 342 to the individual inner electrodes 321 and the corresponding counter-electrodes 322. If the electrode voltage of the transversely adjacent first outer electrodes 331, 332 is applied to the inner electrodes 321, 322, the charged particles follow the second partial path 22 extending along the second outer electrodes 341, 342. If, in contrast, the electrode voltage of the transversely adjacent second outer electrodes 341, 342 is applied to the inner electrodes 321, 322, the charged particles follow the first partial path 21 extending along the first outer electrodes 331, 332.

FIG. 22 shows a contacting of the DC voltage electrodes 120 of the first conductor layer 212 of the junction 300 with which the described selective splitting of the beam 10 along the first or second partial path 21, 22 is possible. The junction 300 in each case comprises a first supply line 351 and a second supply 352 for each of the electrode rows 320, 330, 340, wherein the supply lines 351, 352 are arranged in the further conductor layer 214 and are connected to the DC voltage electrodes 120 of the individual rows 320, 330, 340 in an alternating manner via vias 218 in the longitudinal direction 101.

The first supply lines 351 of the outer electrode rows 330, 340 each guide the first electrode voltage and the second supply lines 352 of the outer electrode rows 330, 340 each guide the second electrode voltage. In the inner electrode row 320, the first supply line 351 can selectively be supplied with the first electrode voltage and the second supply line 352 can be supplied with the second electrode voltage or the first supply line 351 can be supplied with the second electrode voltage and the second supply line 352 can be supplied with the first electrode voltage. In the first-named case, the inner electrodes 321 and the first outer electrodes 331 are at the same electrode voltage and the charged particles follow the second partial path 22 along the second outer electrode row 340. In the second-named case, the inner electrodes 321 and the second outer electrodes 341 are at the same electrode voltage and the charged particles follow the first partial path 21 along the first outer electrode row 330. A contacting of the counter-electrodes takes place analogously such that electrodes disposed opposite one another in the vertical direction 103 have different and opposite electrode voltages.

FIG. 23 shows a further alternative embodiment of the junction 300 with which a beam of charged particles entering along the path 20 can be selectively guided along the first or second partial path 21, 22. Unless differences are apparent from the Figures or the description, the further alternative embodiment of the junction 300 shown in FIG. 23 is designed like the alternative embodiment shown in FIGS. 18, 19 and 22, and vice versa.

The junction 300 shown in FIG. 23 has a first group 115 of electrode arrangements 110 that are arranged along the first path 21 and a second group 116 of electrode arrangements 110 that are arranged along the second partial path 22. In this respect, in each case only the DC voltage electrodes of the electrode arrangements 110 arranged in the first conductor layer 212 are shown in FIG. 23.

The electrode arrangements 110 of the first group 115 and the electrode arrangements 110 of the second group 116 are each alternately arranged along the longitudinal direction 101. The junction 300 is configured to selectively apply either the first and second DC voltages to the DC voltage electrodes of the first group 115 of electrode arrangements 110 to guide the charged particles along the first partial path 21 or to apply the first and second DC voltages to the DC voltage electrodes 120 of the second group 116 of electrode arrangements 110 to guide the charged particles along the second partial path 22.

Compared to the alternative embodiment, described in connection with FIG. 22, of the junction that is configured and contacted as a switch, the further alternative embodiment shown in FIG. 23 does not require supply lines to one and the same DC voltage electrode 120 to be selectively supplied with the first or the second DC voltage. Instead, in the further alternative embodiment shown in FIG. 23, it is sufficient to connect all the DC voltage electrodes only to a single voltage source whose output is selectively connectable to a single electrode voltage or to ground.

FIG. 24 shows a use of the junction 300 described in connection with FIGS. 18 to 21 and configured as a beam splitter in an electron microscope 500. The electron microscope 500 comprises an acceleration apparatus 60 that generates an electron beam 10 and accelerates it with the acceleration voltage $U_A$. After exiting the acceleration apparatus 60, the electron beam 10 is imaged by means of a geometrical optics 510, which comprises a plurality of electron lenses 512, onto the output of the first partial path 21 at the output side 152 of the junction 300 so that the electrons propagate in a transversely confined manner along the first partial path 21 to the input side 150 of the junction 300.

An electron mirror 513 is arranged at the input side 150 of the junction 300 and reflects electrons propagating along the path 20 back into the junction 300. Within the junction 300, the electron beam 10 is subsequently split into a first portion propagating along the first partial path 21 and a second portion propagating along the second partial path 22. The first portion is imaged by the geometrical optics 510 back towards the acceleration apparatus 60 and the second portion is imaged onto a microscopy object 520.

In such an arrangement, the junction 300 can, after a reflection at the electron mirror 513, coherently split the quantum mechanical wave functions of the electrons into transverse quantum states of the first and second partial paths 21, 22. These coherent quantum states can then be used to image the microscopy object 520 in the manner of the quantum Zeno effect with only minimal interaction between the electron beam 10 and the microscopy object 520. In this respect, the measurement method is based on the fact that the presence of the microscopy object 520 prevents a propagation of the electrons in the second partial path 22. Due to the coherence of the wave functions, this can be detected in that a higher proportion of the electron beam 10 is reflected back from the electron mirror 513 into the first partial path 21 than would be the case if the microscopy object 520 were absent.

The foregoing description of the embodiment has been provided for purposes of illustration and description. It is not intended to be exhaustive or to limit the disclosure. Individual elements or features of a particular embodiment are generally not limited to that particular embodiment, but, where applicable, are inter-changeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. An electrode structure for guiding a beam of charged particles along a longitudinal path,
   wherein the electrode structure has multipole electrode arrangements that are spaced apart from one another along the longitudinal path, the multipole electrode arrangements having DC voltage electrodes, the DC voltage electrodes being configured to generate static multipole fields centered around the longitudinal path in transverse planes oriented perpendicular to the longitudinal path,
   wherein field strengths of the static multipole fields in the transverse planes each have a local minimum at a location of the path and increase as a distance from the location of the path increases,
   wherein field directions of the static multipole fields vary periodically with a period length along the longitudinal path so that the charged particles propagating along the longitudinal path are subjected to an inhomogeneous alternating electric field due to their intrinsic movement and experience a transverse return force towards the longitudinal path on average over time, and
   wherein the period length is less than 60 mm.

2. The electrode structure in accordance with claim 1,
   wherein the electrode structure comprises electrode arrangements formed as a junction, and
   wherein the electrode arrangements of the junction vary along the longitudinal path such that the longitudinal path can be split into a first partial path and a second partial path so that a first portion of the charged particles can be guided along the first partial path and a second portion of the charged particles can be guided along the second partial path.

3. The electrode structure in accordance with claim 2,
   wherein a dominant multipole component of the static multipole fields of the electrode arrangements is formed by a quadrupole component at an input side of the longitudinal path and/or at respective output sides of the partial paths in the transverse planes.

4. The electrode structure in accordance with claim 2,
   wherein the electrode arrangements of the junction each comprise three DC voltage electrodes that are arranged next to one another in a transverse direction and that have an inner electrode and two outer electrodes arranged at both sides of the inner electrode,
   wherein the inner and outer electrodes of individual electrode arrangements form three electrode rows extending along the longitudinal path, and
   wherein a transverse width of the inner electrodes increases along the longitudinal path.

5. The electrode structure in accordance with claim 2,
   wherein the junction is configured to simultaneously split incoming charged particles into the first and second portions of charged particles and to simultaneously guide the first portion of charged particles along the first partial path and the second portion of charged particles along the second partial path.

6. The electrode structure in accordance with claim 5,
   wherein a dominant multipole component of the static multipole fields of the electrode arrangements of the junction is formed by a hexapole component in at least one transverse plane.

7. The electrode structure in accordance with claim 2,
   wherein the junction is configured to selectively guide incoming charged particles either as the first portion along the first partial path or as the second portion along the second partial path.

8. The electrode structure in accordance with claim 1,
   wherein the static multipole fields generated by the electrode arrangements vary along the longitudinal path such that only first charged particles and not second charged particles experience a stable confinement along the longitudinal path, and
   wherein the first charged particles have a first longitudinal speed and the second charged particles have a second speed different from the first longitudinal speed.

9. The electrode structure in accordance with claim 8,
   wherein the multipole fields alternate along the longitudinal path by a mean multipole field different from zero so that the particles guided along the longitudinal path are subjected to an inhomogeneous static superposition field, which is defined by the mean multipole field, in addition to the inhomogeneous alternating electric field and only the first charged particles and not the second charged particles perform a stable transverse oscillation along the longitudinal path.

10. The electrode structure in accordance with claim 9,
    wherein a first stability parameter derived from the alternating field and a second stability parameter derived from the superposition field define an operating point within a stability range of a linear multipole trap for the first charged particles and define an operating point outside the stability range of the linear multipole trap for the second charged particles.

11. The electrode structure in accordance with claim 1,
    wherein a longitudinal spacing between individual electrode arrangements is less than 10 mm.

12. The electrode structure in accordance with claim 1,
    wherein the electrode arrangements are arranged directly adjoining one another along the longitudinal path.

13. The electrode structure in accordance with claim 1,
    wherein the electrode arrangements have equal spacings from one another along the longitudinal path.

14. The electrode structure in accordance with claim 1,
    wherein a longitudinal length of the electrode structure along the path amounts to between 1 mm and 1000 mm.

15. The electrode structure in accordance with claim 1,
    wherein the DC voltage electrodes are formed in at least one conductor layer oriented in parallel with the longitudinal path and structured along the longitudinal path.

16. The electrode structure in accordance with claim 15,
    wherein the at least one conductor layer is arranged on a continuous surface extending in parallel with the longitudinal path.

17. The electrode structure in accordance with claim 15,
    wherein the at least one conductor layer is arranged on a carrier structure.

18. The electrode structure in accordance with claim 17, wherein a supply line, which contacts individual DC voltage electrodes of the electrode arrangements, is formed in a further conductor layer of the carrier structure, said further conductor layer extending in parallel with the conductor layer, and is connected to the DC voltage electrodes via vias extending through the carrier structure.

19. The electrode structure in accordance with claim 18, wherein a plurality of supply lines in the further conductor layer extend in parallel with one another along the longitudinal path.

20. The electrode structure in accordance with claim 1, wherein the DC voltage electrodes are formed in two conductor layers arranged spaced apart from one another.

21. The electrode structure in accordance with claim 20, wherein the DC voltage electrodes are formed with mirror symmetry with respect to one another in the two conductor layers.

22. The electrode structure in accordance with claim 1, wherein the DC voltage electrodes of individual electrode arrangements can each be supplied with two oppositely polarized DC voltages.

23. A method of guiding a beam of charged particles along a longitudinal path, the method comprising:
providing an electrode structure, wherein the electrode structure has multipole electrode arrangements that are spaced apart from one another along the longitudinal path, the multipole electrode arrangements having DC voltage electrodes, the DC voltage electrodes being configured to generate static multipole fields centered around the longitudinal path in transverse planes oriented perpendicular to the longitudinal path,
wherein field strengths of the static multipole fields in the transverse planes each have a local minimum at a location of the path and increase as a distance from the location of the path increases, wherein field directions of the static multipole fields vary periodically with a period length along the longitudinal path so that the charged particles propagating along the longitudinal path are subjected to an inhomogeneous alternating electric field due to their intrinsic movement and experience a transverse return force towards the longitudinal path on average over time, and
wherein the period length is less than 60 mm;
applying electrode voltages varying periodically along the longitudinal path to the DC voltage electrodes of the electrode arrangements so that charged particles propagating along the path are subjected to an oscillating inhomogeneous alternating electric field due to their intrinsic movement and experience a transverse return force towards the longitudinal path on average over time;
feeding the charged particles along the longitudinal path into the electrode structure; and
guiding the charged particles along the longitudinal path by the transverse return force.

24. An electrode structure for guiding a beam of charged particles along a longitudinal path,
wherein the electrode structure has multipole electrode arrangements that are spaced apart from one another along the longitudinal path, the multipole electrode arrangements having DC voltage electrodes, the DC voltage electrodes being configured to generate static multipole fields centered around the longitudinal path in transverse planes oriented perpendicular to the longitudinal path,
wherein field strengths of the static multipole fields in the transverse planes each have a local minimum at a location of the path and increase as a distance from the location of the path increases,
wherein field directions of the static multipole fields vary periodically with a period length along the longitudinal path so that the charged particles propagating along the longitudinal path are subjected to an inhomogeneous alternating electric field due to their intrinsic movement and experience a transverse return force towards the longitudinal path on average over time,
wherein the electrode structure comprises electrode arrangements formed as a junction,
wherein the electrode arrangements of the junction vary along the longitudinal path such that the longitudinal path can be split into a first partial path and a second partial path so that a first portion of the charged particles can be guided along the first partial path and a second portion of the charged particles can be guided along the second partial path,
wherein the electrode arrangements of the junction each comprise three DC voltage electrodes that are arranged next to one another in a transverse direction and that have an inner electrode and two outer electrodes arranged at both sides of the inner electrode,
wherein the inner and outer electrodes of individual electrode arrangements form three electrode rows extending along the longitudinal path, and
wherein a transverse width of the inner electrodes increases along the longitudinal path.

* * * * *